(12) United States Patent
Zhou et al.

(10) Patent No.: US 12,237,325 B2
(45) Date of Patent: Feb. 25, 2025

(54) THREE-DIMENSIONAL FIELD EFFECT DEVICE

(71) Applicant: INTERNATIONAL BUSINESS MACHINES CORPORATION, Armonk, NY (US)

(72) Inventors: Huimei Zhou, Albany, NY (US); Su Chen Fan, Cohoes, NY (US); Shogo Mochizuki, Clifton Park, NY (US); Peng Xu, Santa Clara, CA (US); Nicolas J. Loubet, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 51 days.

(21) Appl. No.: 17/136,860

(22) Filed: Dec. 29, 2020

(65) Prior Publication Data
US 2021/0118873 A1 Apr. 22, 2021

Related U.S. Application Data

(62) Division of application No. 15/979,608, filed on May 15, 2018, now Pat. No. 10,971,490.

(51) Int. Cl.
*H01L 27/06* (2006.01)
*H01L 21/02* (2006.01)
(Continued)

(52) U.S. Cl.
CPC .... *H01L 27/0688* (2013.01); *H01L 21/02115* (2013.01); *H01L 21/02164* (2013.01);
(Continued)

(58) Field of Classification Search
CPC ......... H01L 21/823487; H01L 27/0688; H01L 27/11551; H01L 27/11578; H01L 27/11514; H01L 29/6656
See application file for complete search history.

(56) References Cited

U.S. PATENT DOCUMENTS 5,610,085 A 3/1997 Yuan et al.
7,804,137 B2 9/2010 Kang et al.
(Continued)

OTHER PUBLICATIONS

List of IBM Patents or Patent Applications Treated as Related dated Dec. 29, 2020, 2 pages.

*Primary Examiner* — Phat X Cao
(74) *Attorney, Agent, or Firm* — Tutunjian & Bitetto, P.C.; Samuel Waldbaum

(57) ABSTRACT

A method of forming stacked vertical field effect devices is provided. The method includes forming a layer stack on a substrate, wherein the layer stack includes a first spacer layer on the substrate, a first protective liner on the first spacer layer, a first gap layer on the first protective liner, a second protective liner on the first gap layer, a second spacer layer on the second protective liner, a sacrificial layer on the second spacer layer, a third spacer layer on the sacrificial layer, a third protective liner on the third spacer layer, a second gap layer on the third protective liner, a fourth protective liner on the second gap layer, and a fourth spacer layer on the fourth protective liner. The method further includes forming channels through the layer stack, a liner layer on the sidewalls of the channels, and a vertical pillar in the channels.

19 Claims, 10 Drawing Sheets

(51) Int. Cl.
*H01L 21/822* (2006.01)
*H01L 21/8234* (2006.01)
*H01L 27/088* (2006.01)
*H01L 29/10* (2006.01)
*H01L 29/66* (2006.01)
*H01L 29/78* (2006.01)
*H10B 41/20* (2023.01)
*H10B 43/20* (2023.01)
*H10B 53/20* (2023.01)
*H01L 21/306* (2006.01)
*H01L 21/3065* (2006.01)
*H01L 21/311* (2006.01)
*H01L 29/417* (2006.01)

(52) U.S. Cl.
CPC .. *H01L 21/02167* (2013.01); *H01L 21/02532* (2013.01); *H01L 21/02592* (2013.01); *H01L 21/8221* (2013.01); *H01L 21/823412* (2013.01); *H01L 21/823487* (2013.01); *H01L 27/088* (2013.01); *H01L 29/1037* (2013.01); *H01L 29/6656* (2013.01); *H01L 29/66666* (2013.01); *H01L 29/7827* (2013.01); *H10B 41/20* (2023.02); *H10B 43/20* (2023.02); *H10B 53/20* (2023.02); *H01L 21/30625* (2013.01); *H01L 21/3065* (2013.01); *H01L 21/31111* (2013.01); *H01L 29/41741* (2013.01)

(56) References Cited

U.S. PATENT DOCUMENTS

| | | | |
|---|---|---|---|
| 8,445,347 B2 | 5/2013 | Alsmeier | |
| 9,000,409 B2 | 4/2015 | Huo et al. | |
| 9,419,003 B1* | 8/2016 | Colinge | H01L 29/41741 |
| 9,659,963 B2 | 5/2017 | Cheng et al. | |
| 9,680,473 B1 | 6/2017 | Anderson et al. | |
| 9,780,208 B1* | 10/2017 | Xie | H01L 27/088 |
| 9,818,875 B1* | 11/2017 | Bi | H01L 29/41791 |
| 9,824,933 B1 | 11/2017 | Pawlak | |
| 10,410,925 B2* | 9/2019 | Sills | H01L 21/8221 |
| 2006/0261406 A1 | 11/2006 | Chen | |
| 2011/0012085 A1* | 1/2011 | Deligianni | H01L 29/78642 257/E21.409 |
| 2016/0043074 A1 | 2/2016 | Hurley et al. | |
| 2016/0204251 A1* | 7/2016 | Masuoka | H01L 27/0688 257/329 |
| 2016/0211259 A1* | 7/2016 | Guo | H01L 27/092 |
| 2017/0025412 A1* | 1/2017 | Jun | H01L 29/775 |
| 2017/0213900 A1 | 7/2017 | Cheng et al. | |
| 2017/0263749 A1 | 9/2017 | Chang et al. | |

* cited by examiner

THREE-DIMENSIONAL FIELD EFFECT DEVICE

BACKGROUND

Technical Field

The present invention generally relates to forming field effect devices, and more particularly to forming an arrangement of field effect transistors.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS) device, where a p-channel MOSFET and n-channel MOSFET are coupled together.

SUMMARY

In accordance with an embodiment of the present invention, a method of forming stacked vertical field effect devices is provided. The method includes forming a layer stack on a surface of a substrate, wherein the layer stack includes a first spacer layer on the substrate, a first protective liner on the first spacer layer, a first gap layer on the first protective liner, a second protective liner on the first gap layer, a second spacer layer on the second protective liner, a sacrificial layer on the second spacer layer, a third spacer layer on the sacrificial layer, a third protective liner on the third spacer layer, a second gap layer on the third protective liner, a fourth protective liner on the second gap layer, and a fourth spacer layer on the fourth protective liner. The method further includes forming a plurality of channels through the layer stack to the surface of the substrate, forming a liner layer on the sidewalls of each of the plurality of channels, and forming a vertical pillar in each of the channels.

In accordance with another embodiment of the present invention, a method of forming stacked vertical field effect devices is provided. The method includes forming one or more channels through a first spacer layer, a first protective liner, a first gap layer, a second protective liner, a second spacer layer, a sacrificial layer, a third spacer layer, a third protective liner, a second gap layer, a fourth protective liner, and a fourth spacer layer to a top surface of a substrate. The method further includes forming a vertical pillar in each of the one or more channels.

In accordance with yet another embodiment of the present invention, a stacked vertical field effect device is provided. The stacked vertical field effect device includes a lower vertical device segment, an upper vertical device segment co-linear with the lower vertical device segment, and a recess fill between the upper vertical device segment and the lower vertical device segment.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate generally to forming multiple vertical transport field effect transistors (VT FETs) stacked on top of each other to increase device density, while making the fabrication process more efficient by reducing the number of masking and etching processes involved in forming multiple devices. In various embodiments, two, three, four, or more VT FETs can be stacked in a column.

Embodiments of the present invention relate generally to forming three-dimensional (3-D) field effect devices through stacking multiple vertical device segments in a column and forming conductive lines and source/drains as a unified process to produce multiple collinear vertical transport field effect transistors. The conductive lines can be formed orthogonal to and in electrical connection with the vertical device segments forming the device channels of the stacked VT FETs by removing bars of the same material layer adjoining the vertical device segments. There can be conductive lines perpendicular to the orthogonal bars that electrically connect the orthogonal bars of upper and lower devices. The vertical columns can be semiconductor material, whereas the conductive lines can be a metal or metal alloy.

Embodiments of the present invention relate generally to forming n-type FETs and p-type FETs stacked on top of each other by alternating n-doped and p-doped layers in a layer stack for forming multiple VT FETs. Different regions of a substrate can have different orders of alternating n-doped and p-doped layers, such that a different sequence of n-type and p-type VT FETs can be formed on different regions of the substrate.

Embodiments of the present invention relate generally to forming source/drains above and/or below device channels by alternating the expitaxial growth and dopant type and concentration when forming the vertical columns for the multiple VT FETs. Conductive lines can be formed to the different doped layers to form the VT FET source, drain, and gate connections.

Exemplary applications/uses to which the present invention can be applied include, but are not limited to: complementary metal-oxide-semiconductor (CMOS) devices for logic circuits (e.g., NAND gates, NOR gates, inverters, etc.) and memories (e.g., flip-flops, static random access memory (SRAM), dynamic random access memory (DRAM), electrically erasable programmable read-only memory (EEPROM), etc.), and application specific integrated circuits (ASICs).

It is to be understood that aspects of the present invention will be described in terms of a given illustrative architecture; however, other architectures, structures, substrate materials and process features and steps can be varied within the scope of aspects of the present invention.

Figure 1:
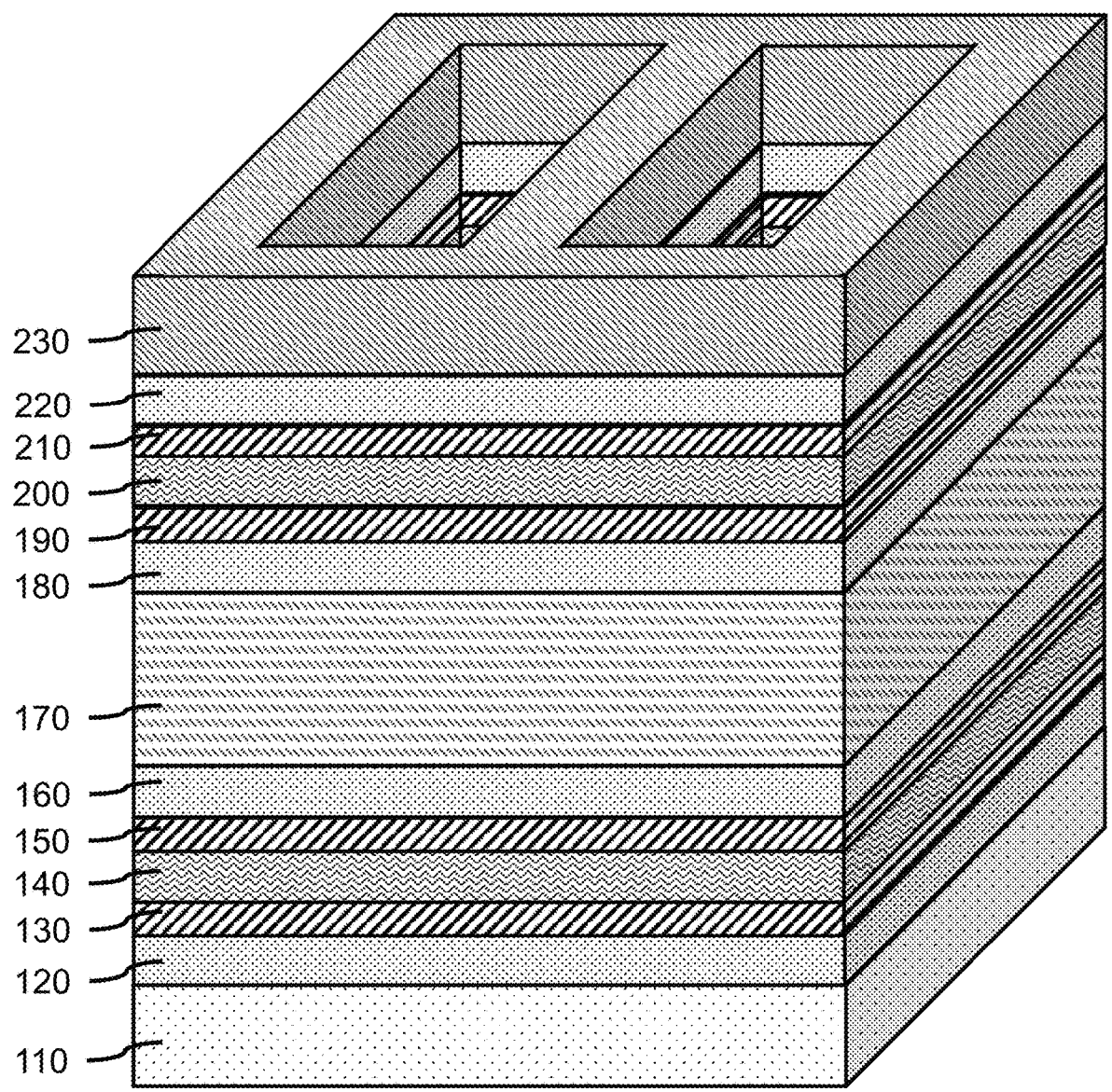
FIG. 1 is a three-dimensional view showing a patterned mask layer on a layer stack, in accordance with an embodiment of the present invention.

Referring now to the drawings in which like numerals represent the same or similar elements and initially to FIG. 1, a patterned mask layer on a layer stack is shown, in accordance with an embodiment of the present invention.

In one or more embodiments, a substrate 110 can be, for example, a single crystal semiconductor material wafer or a semiconductor-on-insulator stacked wafer. The substrate can include a support layer that provides structural support, and an active semiconductor layer that can form devices. An insulating layer (e.g., a buried oxide (BOX) layer) may be between the active semiconductor layer and the support layer to form a semiconductor-on-insulator substrate (SeOI) (e.g., a silicon-on-insulator substrate (SOI)), or an implanted layer can form a buried insulating material.

The support layer can include crystalline, semi-crystalline, micro-crystalline, nano-crystalline, and/or amorphous phases. The support layer can be a semiconductor (e.g., silicon (Si), silicon carbide (SiC), silicon-germanium (SiGe), germanium (Ge), gallium-arsenide (GaAs), cadmium-telluride (CdTe), etc.), an insulator (e.g.: glass (e.g. silica, borosilicate glass), ceramic (e.g., aluminum oxide ($Al_2O_3$), sapphire), plastic (e.g., polycarbonate, polyacetonitrile), metal (e.g. aluminum, gold, titanium, molybdenum-copper (MoCu) composites, etc.), or combination thereof.

The wafer or active semiconductor layer can include a crystalline, semi-crystalline, micro-crystalline, nano-crystalline, and/or amorphous semiconductor, for example, a IV or IV-IV semiconductor (e.g., silicon (Si), silicon carbide (SiC), silicon-germanium (SiGe), germanium (Ge)), a III-V semiconductor (e.g., gallium-arsenide (GaAs), indium-phosphide (InP), indium-antimonide (InSb)), a II-VI semiconductor (e.g., cadmium-telluride (CdTe), zinc-telluride (ZnTe), zinc sulfide (ZnS), zinc selenide (ZnSe)), or a IV-VI semiconductor (e.g., tin sulfide (SnS), lead selenide (PbSb)).

The surface of the substrate 110 can have a crystalline face on which additional layers can be epitaxially grown/deposited, for example, a silicon {100} crystal face.

In one or more embodiments, a first spacer layer 120 can be formed on the surface of the substrate 110, where the first spacer layer 120 can be formed by a blanket deposition, for example, chemical vapor deposition (CVD), plasma enhanced CVD (PECVD), physical vapor deposition (PVD), or spin-on deposition.

In one or more embodiments, the first spacer layer 120 can have a thickness in a range of about 10 nanometers (nm) to about 20 nm, or in a range of about 12 nm to about 15 nm, although other thicknesses are also contemplated. The thickness of the first spacer layer 120 can determine the thickness (i.e., height) of a subsequently formed source/drain or conductive line.

In one or more embodiments, the first spacer layer 120 can be a dielectric material including, but not be limited to, silicon oxide (SiO), silicon nitride (SiN), a silicon oxynitride (SiON), a silicon carbonitride (SiCN), a silicon oxycarbonitride (SiOCN), a silicon boronitride (SiBN), a silicon borocarbide (SiBC), a low-K dielectric, or combinations thereof. A low-K dielectric can include amorphous carbon (a-C), fluorine doped silicon oxide (SiO:F), carbon doped silicon oxide (SiO:C), SiCOH, silicon boro carbonitride (SiBCN), or a combination thereof. Other examples include, Applied Material's Black Diamond™. The material of the first spacer layer 120 can be selected such that the first spacer layer 120 can be selectively removed relative to other exposed layers. Multiple layers can be made of the same material to allow simultaneous removal of material portions from each of the multiple layers.

Selective removal refers to the ability to remove one material without notably effecting other materials due to differences in etch rate and/or etch chemistry.

In one or more embodiments, a first protective liner 130 can be formed on the surface of the first spacer layer 120, wherein the first protective liner 130 can be formed by a blanket deposition (e.g., CVD, PECVD, PVD, spin-on).

In one or more embodiments, the first protective liner 130 can have a thickness in a range of about 5 nanometers (nm) to about 10 nm, or in a range of about 7 nm to about 8 nm, although other thicknesses are also contemplated. The first protective liner 130 can be thinner than the first spacer layer 120. The first protective liner 130 can provide an insulating layer between subsequently formed adjacent conductor and/or semiconductor layers, for example, source/drains and gates.

In one or more embodiments, the first protective liner 130 can be an insulating, dielectric material, including, but not be limited to, silicon oxide (SiO), silicon nitride (SiN), a silicon oxynitride (SiON), a silicon carbonitride (SiCN), a silicon oxycarbonitride (SiOCN), a silicon boronitride (SiBN), a silicon borocarbide (SiBC), a low-K dielectric, or combinations thereof. A low-K dielectric can include amorphous carbon (a-C), fluorine doped silicon oxide (SiO:F), carbon doped silicon oxide (SiO:C), SiCOH, silicon boro carbonitride (SiBCN), or a combination thereof. Other examples include, Applied Material's Black Diamond™. The material of the first protective liner 130 can be selected such that the first protective liner 130 can be selectively removed relative to the first spacer layer 120 and other exposed layers. Multiple liner layers can be made of the same material to allow simultaneous removal of material portions from each of the protective liners.

In one or more embodiments, a first gap layer 140 can be formed on the surface of the first protective liner 130, wherein the first gap layer 140 can be formed by a blanket deposition (e.g., CVD, PECVD, PVD, spin-on).

In one or more embodiments, the first gap layer 140 can have a thickness in a range of about 10 nm to about 30 nm, or in a range of about 15 nm to about 25 nm, although other thicknesses are also contemplated. The first gap layer 140 can determine the length of a subsequently formed gate on a semiconductor column forming a device channel.

In one or more embodiments, the first gap layer 140 can be a dielectric material including, but not be limited to, silicon oxide (SiO), silicon nitride (SiN), a silicon oxynitride (SiON), a silicon carbonitride (SiCN), a silicon oxycarbonitride (SiOCN), a silicon boronitride (SiBN), a silicon borocarbide (SiBC), a low-K dielectric, or combinations thereof. A low-K dielectric can include amorphous carbon (a-C), fluorine doped silicon oxide (SiO:F), carbon doped silicon oxide (SiO:C), SiCOH, silicon boro carbonitride (SiBCN), or a combination thereof. Other examples include, Applied Material's Black Diamond™. The material of the first gap layer 140 can be selected such that the first gap layer 140 can be selectively removed relative to the first spacer layer 120 and first protective liner 130, as well as other exposed layers. Multiple gap layers can be made of the same material to allow simultaneous removal of material portions from each of the multiple gap layers.

In one or more embodiments, a second protective liner 150 can be formed on the surface of the first gap layer 140, wherein the second protective liner 150 can be formed by a blanket deposition (e.g., CVD, PECVD, PVD, spin-on).

In one or more embodiments, the second protective liner 150 can have a thickness in a range of about 5 nm to about 10 nm, or in a range of about 7 nm to about 8 nm, although other thicknesses are also contemplated. The second protective liner 150 can provide an insulating layer between subsequently formed adjacent conductor and/or semiconductor layers, for example, source/drains and gates.

In one or more embodiments, the second protective liner 150 can be an insulating, dielectric material including, but not be limited to, silicon oxide (SiO), silicon nitride (SiN), a silicon oxynitride (SiON), a silicon carbonitride (SiCN), a silicon oxycarbonitride (SiOCN), a silicon boronitride (SiBN), a silicon borocarbide (SiBC), a low-K dielectric, or combinations thereof. A low-K dielectric can include amorphous carbon (a-C), fluorine doped silicon oxide (SiO:F), carbon doped silicon oxide (SiO:C), SiCOH, silicon boro carbonitride (SiBCN), or a combination thereof. Other examples include, Applied Material's Black Diamond™. The material of the second protective liner 150 can be selected such that the second protective liner 150 can be selectively removed relative to the first gap layer 140 and first spacer layer 120, as well as other exposed layers. The second protective liner 150 and first protective liner 130 can be made of the same material, so portions of the first protective liner 130 and second protective liner 150 can be removed at the same time using the same etching process.

In one or more embodiments, a second spacer layer 160 can be formed on the surface of the second protective liner 150, where the second spacer layer 160 can be formed by a blanket deposition, for example, chemical vapor deposition (CVD), plasma enhanced CVD (PECVD), physical vapor deposition (PVD), or spin-on deposition.

In one or more embodiments, the second spacer layer 160 can have a thickness in a range of about 10 nm to about 20 nm, or in a range of about 12 nm to about 15 nm, although other thicknesses are also contemplated. The thickness of the second spacer layer 160 can determine the thickness (i.e., height) of a subsequently formed source/drain or conductive line.

In one or more embodiments, the second spacer layer 160 can be a dielectric material including, but not be limited to, silicon oxide (SiO), silicon nitride (SiN), a silicon oxynitride (SiON), a silicon carbonitride (SiCN), a silicon oxycarbonitride (SiOCN), a silicon boronitride (SiBN), a silicon borocarbide (SiBC), a low-K dielectric, Applied Material's Black Diamond™, or combinations thereof. The material of the second spacer layer 160 can be selected such that the second spacer layer 160 can be selectively removed relative to other exposed layers. The material of the second spacer layer 160 and the first spacer layer 120 can be the same, so portions of the first spacer layer 120 and second spacer layer 160 can be removed at the same time using the same etching process.

In one or more embodiments, a sacrificial layer 170 can be formed on the second spacer layer 160, where the sacrificial layer 170 can be formed by a blanket deposition.

In one or more embodiments, the sacrificial layer 170 can be amorphous silicon (a-Si), silicon-germanium (SiGe), or amorphous carbon (a-C), where the sacrificial layer 170 can be a material different from the first and second spacer layers 120, 160, first and second protective liners 130, 150, and the first gap layer 140. In various embodiments, the sacrificial layer 170 can be selectively removed relative to all other exposed layers.

In one or more embodiments, the sacrificial layer 170 can have a thickness in a range of about 20 nm to about 50 nm, or in a range of about 30 nm to about 40 nm, although other thicknesses are also contemplated. The thickness of the sacrificial layer 170 can determine the thickness of a subsequently formed dielectric separation layer that divides and electrically separates the stacked devices and connecting lines.

In one or more embodiments, a third spacer layer 180 can be formed on the surface of the sacrificial layer 170, where the third spacer layer 180 can be formed by a blanket deposition, for example, chemical vapor deposition (CVD), plasma enhanced CVD (PECVD), physical vapor deposition (PVD), or spin-on deposition.

In one or more embodiments, the third spacer layer 180 can have a thickness in a range of about 10 nm to about 20 nm, or in a range of about 12 nm to about 15 nm, although other thicknesses are also contemplated. The thickness of the first spacer layer 120 can determine the thickness (i.e., height) of a subsequently formed source/drain or conductive line.

In one or more embodiments, the third spacer layer 180 can be a dielectric material including, but not be limited to, silicon oxide (SiO), silicon nitride (SiN), a silicon oxynitride (SiON), a silicon carbonitride (SiCN), a silicon oxycarbonitride (SiOCN), a silicon boronitride (SiBN), a silicon borocarbide (SiBC), a low-K dielectric, Black Diamond™, or combinations thereof. The material of the third spacer layer 180 can be the same material as the first and second spacer layers to allow simultaneous removal of material portions from each of the multiple spacer layers.

In one or more embodiments, a third protective liner 190 can be formed on the surface of the third spacer layer 180, wherein the third protective liner 190 can be formed by a blanket deposition.

In one or more embodiments, the third protective liner 190 can have a thickness in a range of about 5 nm to about 10 nm, or in a range of about 7 nm to about 8 nm, although other thicknesses are also contemplated. The third protective liner 190 can provide an insulating layer between subsequently formed adjacent conductor and/or semiconductor layers.

In one or more embodiments, the third protective liner 190 can be a dielectric material that can be the same material as the first and second protective liners 130, 150 to allow simultaneous removal of material portions from each of the protective liners.

In one or more embodiments, a second gap layer 200 can be formed on the surface of the third protective liner 190, wherein the second gap layer 200 can be formed by a blanket deposition.

In one or more embodiments, the second gap layer 200 can have a thickness in a range of about 10 nm to about 30 nm, or in a range of about 15 nm to about 25 nm, although other thicknesses are also contemplated. The thickness of the second gap layer 200 can determine the length of a second subsequently formed gate on a semiconductor column forming a device channel.

In one or more embodiments, the second gap layer 200 can be a dielectric material including, but not limited to, silicon oxide (SiO), silicon nitride (SiN), a silicon oxynitride (SiON), a silicon carbonitride (SiCN), a silicon oxycarbonitride (SiOCN), a silicon boronitride (SiBN), a silicon borocarbide (SiBC), a low-K dielectric, Black Diamond™, or combinations thereof. The material of the second gap layer 200 can be selected such that the second gap layer 200 can be selectively removed relative to the other exposed layers. Multiple gap layers can be made of the same material to allow simultaneous removal of material portions from each of the gap layers.

In one or more embodiments, a fourth protective liner 210 can be formed on the surface of the second gap layer 200, wherein the fourth protective liner 210 can be formed by a blanket deposition.

In one or more embodiments, the fourth protective liner 210 can have a thickness in a range of about 5 nm to about 10 nm, or in a range of about 7 nm to about 8 nm, although other thicknesses are also contemplated. The fourth protective liner 210 can provide an insulating layer between subsequently formed adjacent conductor and/or semiconductor layers.

In one or more embodiments, the fourth protective liner 210 can be an insulating, dielectric material including, but not be limited to, silicon oxide (SiO), silicon nitride (SiN), a silicon oxynitride (SiON), a silicon carbonitride (SiCN), a silicon oxycarbonitride (SiOCN), a silicon boronitride (SiBN), a silicon borocarbide (SiBC), a low-K dielectric, Black Diamond™, or combinations thereof. The material of the fourth protective liner 210 can be selected such that the fourth protective liner 210 can be selectively removed relative to the third gap layer 200 and third spacer layer 180, as well as other exposed layers. The fourth protective liner 210 and third protective liner 190 can be made of the same material, so portions can be removed at the same time using the same etching process.

In one or more embodiments, a fourth spacer layer 220 can be formed on the surface of the fourth protective liner 210, where the second spacer layer 160 can be formed by a blanket deposition.

In one or more embodiments, the fourth spacer layer 220 can have a thickness in a range of about 10 nm to about 20 nm, or in a range of about 12 nm to about 15 nm, although other thicknesses are also contemplated. The thickness of the fourth spacer layer 220 can determine the thickness (i.e., height) of a subsequently formed source/drain or conductive line.

In one or more embodiments, the fourth spacer layer 220 can be an insulating, dielectric material including, but not be limited to, silicon oxide (SiO), silicon nitride (SiN), a silicon oxynitride (SiON), a silicon carbonitride (SiCN), a silicon oxycarbonitride (SiOCN), a silicon boronitride (SiBN), a silicon borocarbide (SiBC), a low-K dielectric, Black Diamond™, or combinations thereof. The fourth spacer layer 220 and third spacer layer 180 can be made of the same material, so portions can be removed at the same time using the same etching process.

In one or more embodiments, additional sequences of the layer stack can be formed on top of the fourth spacer layer 220 to provide a suitable layer stack for forming a predetermined number of stacked VT FET devices in the same column. A sacrificial layer can be formed between each set of spacer layers, protective liners, and gap layer to separate the stacked devices.

In one or more embodiments, a lithographic mask layer 230 can be formed on the fourth spacer layer 220, or a top spacer layer of an additionally formed set of layers, where the lithographic mask layer 230 can be blanket deposited. The lithographic mask layer 230 can be a hardmask a softmask or a combination thereof. A hardmask can be a dielectric material. A soft mask can be a polymeric resist material used for lithographic patterning.

In one or more embodiments, the lithographic mask layer 230 can be patterned to form a plurality of openings that exposes portions of the fourth spacer layer 220. The openings may be rectangular or square.

Figure 2:
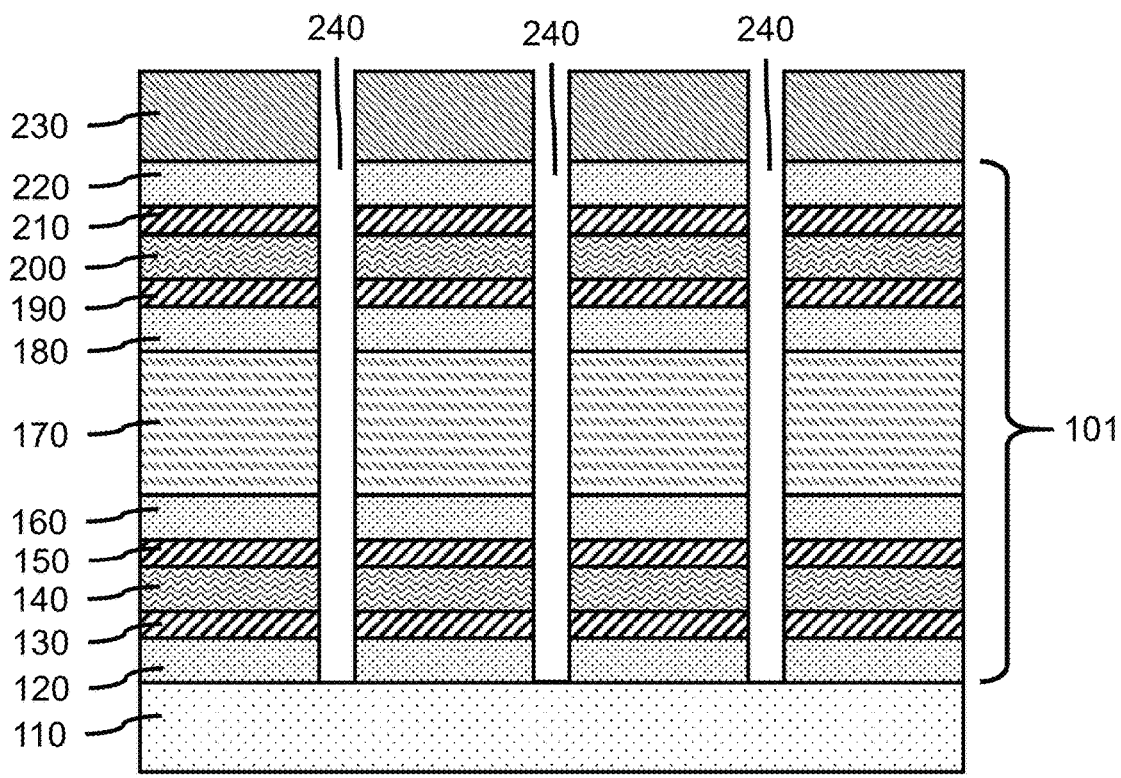
FIG. 2 is a cross-sectional side view showing a plurality of channels formed in the layer stack, in accordance with an embodiment of the present invention.

FIG. 2 is a cross-sectional side view showing a plurality of channels formed in the layer stack, in accordance with an embodiment of the present invention Exposed portions of the fourth spacer layer 220 and the underlying layers 210, 200, 190, 180, 170, 160, 150, 140, 130, 120 of the layer stack 101 can be removed using a non-selective etch, or a sequence of selective etches for each of the different materials to form channels 240 through each of the layers 220, 210, 200, 190, 180, 170, 160, 150, 140, 130, 120 down to the surface of the substrate 110. The thicknesses of the layers can determine the depth of the channels 240.

In one or more embodiments, channels 240 can have a width, W, in a range of about 10 nm to about 20 nm, or about 12 nm to about 15 nm, although other widths are contemplated.

In one or more embodiments, channels 240 can have a length, L, in a range of about 10 nm to about 100 nm, or about 40 nm to about 75 nm, although other widths are contemplated. The length and width of the channels can provide a rectangular shape with a length greater than the width, or a square shape where the length and width are the same.

In various embodiments, the height (i.e., depth)/width aspect ratio of channels 240 can be about 4.5 or greater based on the number of layers in the stack.

Figure 3:
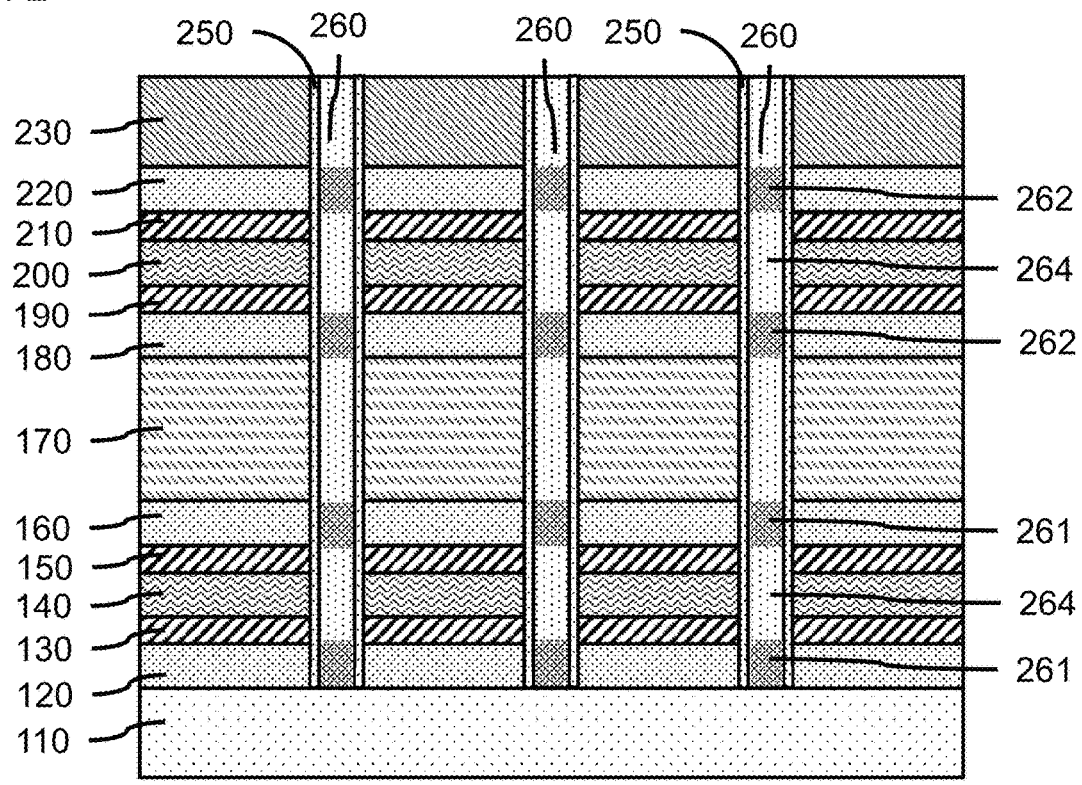
FIG. 3 is a cross-sectional side view showing a liner layer and a vertical pillar in each of the plurality of channels, in accordance with an embodiment of the present invention.

FIG. 3 is a cross-sectional side view showing a liner layer and a vertical pillar in each of the plurality of channels, in accordance with an embodiment of the present invention.

In one or more embodiments, a liner layer 250 can be formed on the exposed sidewalls of the layers 210, 200, 190, 180, 170, 160, 150, 140, 130, 120 to cover the exposed material surfaces.

In one or more embodiments, the liner layer 250 can be an insulating, dielectric material including, but not be limited to, silicon oxide (SiO), silicon nitride (SiN), silicon oxynitride (SiON), silicon carbonitride (SiCN), silicon oxycarbonitride (SiOCN), silicon boronitride (SiBN), silicon borocarbide (SiBC), low-K dielectrics, or combinations thereof. The liner layer 250 can be a material different from all of the other layers 220, 210, 200, 190, 180, 170, 160, 150, 140, 130, 120 110 to allow selective removal of the liner layer relative to any adjoining layer.

In various embodiments, the liner layer 250 can be formed by a conformal deposition, for example, atomic layer deposition (ALD) or plasma enhanced ALD (PEALD). A portion of the liner layer 250 on the exposed surface of the substrate 110 can be removed using a directional etch (e.g., RIE) to expose the substrate surface for expitaxial or heteroepitaxial growth.

In one or more embodiments, a vertical pillar 260 can be formed in each lined channel 240, where the vertical pillars 260 can be formed by epitaxial or heteroepitaxial growth on the exposed surface of the substrate 110. Epitaxy and heteroepitaxy can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE). Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) can be doped during deposition/epitaxy (in-situ doped) by adding dopants, n-type dopants (e.g., phosphorus or arsenic) or p-type dopants (e.g., boron or gallium), depending on the type of transistor being fabricated. The terms "epitaxial growth and/or deposition" and "epitaxially formed and/or grown," relates to the growth of a material (crystalline material) on a deposition surface of another material (crystalline material), in which the material being formed (crystalline over layer) has substantially the same crystalline characteristics as the material of the deposition surface (seed material). Heteroepitaxy refers to epitaxial growth of a material with a different chemical composition than the seed material on the deposition surface.

In various embodiments, the in-situ doping can be controlled to form vertical sections of the vertical pillar 260 with n-type dopants 261, p-type dopants 262, or no dopants 264 (i.e., intrinsic) to form internal source/drains and device channel regions along the height of the vertical pillar 260. The placement of the n-type dopants, p-type dopants, or no dopants can be aligned with the previously formed layers to align with subsequently formed gates and electrical connecting lines. Each of the vertical pillars 260 can include a plurality of doped regions 261, 262 separated by intrinsic regions 264.

Figure 4:
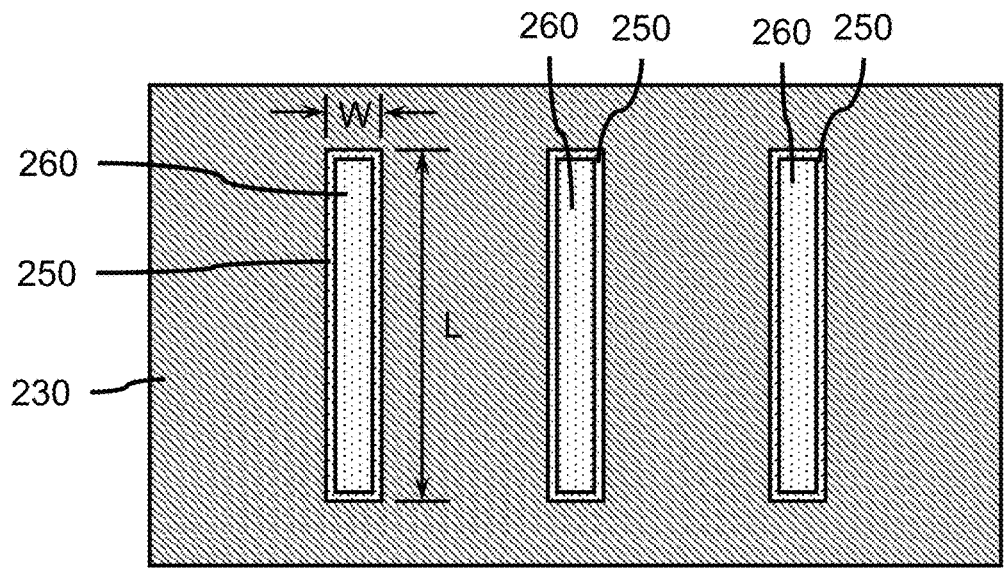
FIG. 4 is a top view showing the liner layers and the plurality of vertical pillars in the channels, in accordance with an embodiment of the present invention.

FIG. 4 is a top view showing the liner layers and the plurality of vertical pillars in the channels, in accordance with an embodiment of the present invention.

In various embodiments, a liner layer 250 can be formed on the sidewalls and end walls of each of the channels 240, and the vertical pillars 260 can fill in the remaining space of the channels. A chemical-mechanical polishing (CMP) can be used to remove excess vertical pillar material above the top surface of the masking layer 230, and provide a smooth, flat surface.

Figure 5:
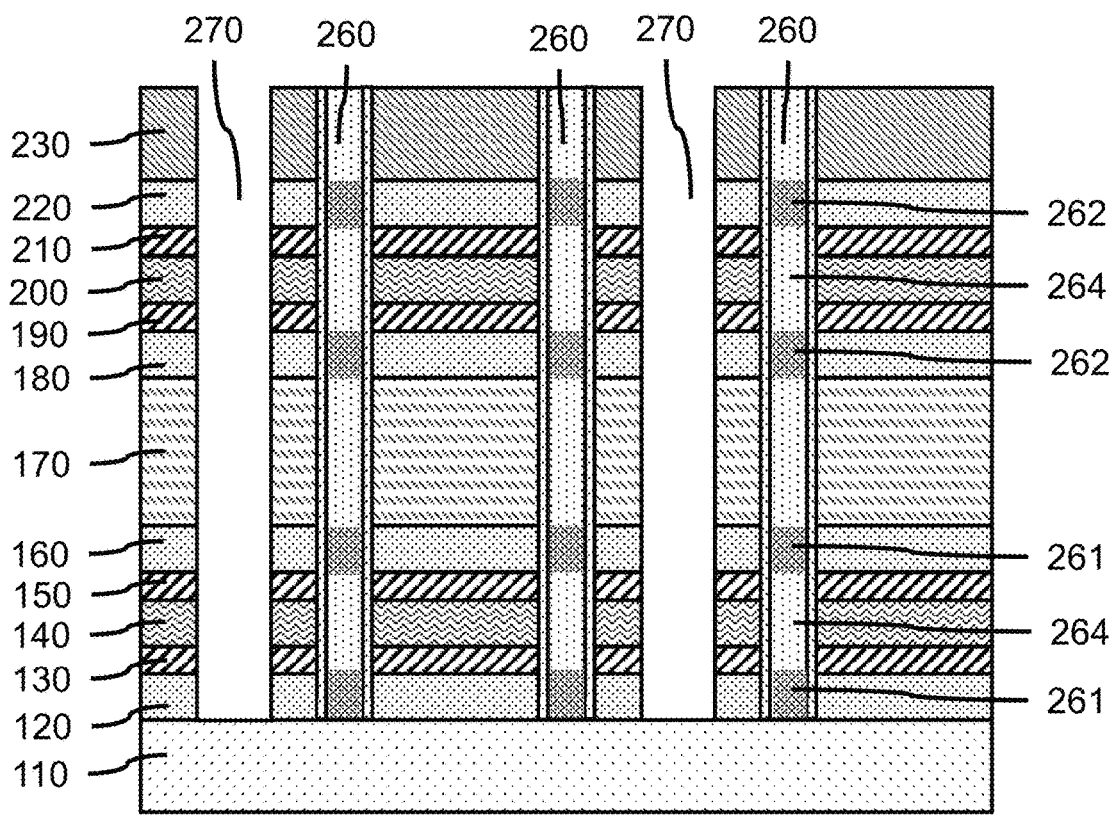
FIG. 5 is a cross-sectional side view showing a plurality of trenches formed in the layer stack spaced apart from the channels with the liner layers and vertical pillars, in accordance with an embodiment of the present invention.

FIG. 5 is a cross-sectional side view showing a plurality of trenches formed in the layer stack spaced apart from the channels with the liner layers and vertical pillars, in accordance with an embodiment of the present invention.

In one or more embodiments, one or more trenches 270 can be formed a distance from each of the vertical pillars 260. The trenches can be formed through the layer stack 101 by a non-selective, directional etch or a series of selective directional etches (e.g., reactive ion etch (RIE)). The trenches 270 can have sidewalls that expose each of the layers 220, 210, 200, 190, 180, 170, 160, 150, 140, 130, 120 down to the substrate 110.

Figure 6:
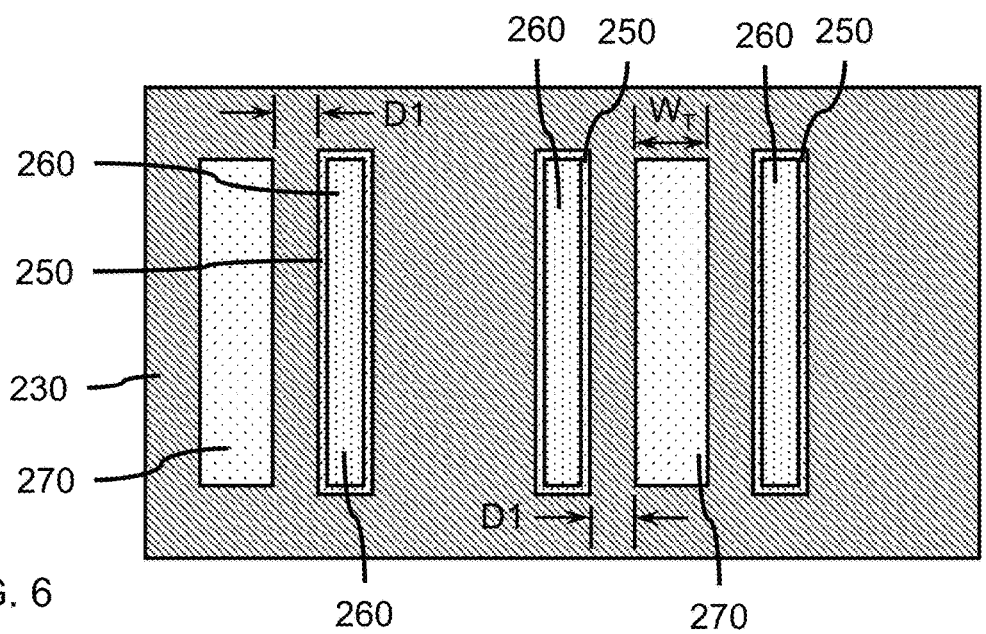
FIG. 6 is a top view showing the trenches adjacent to the liner layer and vertical pillar in each of the plurality of channels, in accordance with an embodiment of the present invention.

FIG. 6 is a top view showing the trenches adjacent to the liner layer and vertical pillar in each of the plurality of channels, in accordance with an embodiment of the present invention.

In one or more embodiments, trenches 270 can have a width, $W_T$, in a range of about 10 nm to about 30 nm, or about 15 nm to about 25 nm, although other widths are contemplated.

In one or more embodiments, trenches 270 can have a length in a range of about 10 nm to about 100 nm, or about 40 nm to about 75 nm, although other lengths are contemplated. The length of the trenches 270 can be equal to or less than the length of the vertical pillars 260 in the channels.

In various embodiments, the trenches 270 can be positioned a distance from each of the vertical pillars 260, such that the distance determines the width of a source/drain, gate, and/or connecting line. In various embodiments, each trench 270 can be a distance, D1, in a range of about 10 nm to about 50 nm, or about 15 nm to about 50 nm, or about 15 nm to about 40 nm from an adjacent vertical pillar 260.

Figure 7:
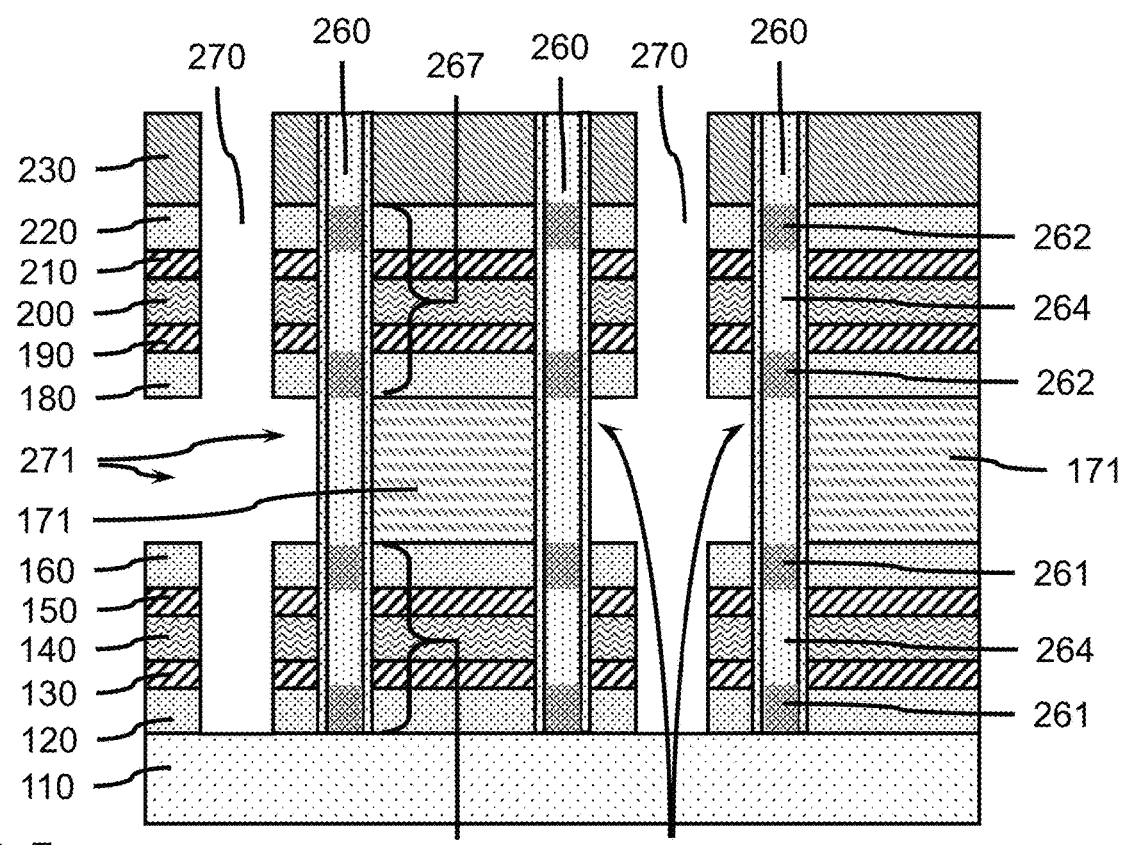
FIG. 7 is a cross-sectional side view showing portions of the sacrificial layer exposed by the trenches removed to form recesses, in accordance with an embodiment of the present invention.

FIG. 7 is a cross-sectional side view showing portions of the sacrificial layer exposed by the trenches removed to form recesses, in accordance with an embodiment of the present invention.

In one or more embodiments, a portion of the sacrificial layer 170 exposed by formation of a trench 270 can be selectively removed using an isotropic etch, for example, a wet chemical etch or dry plasma etch, to form recesses 271 between the second spacer layer 160 and third spacer layer 180. The liner layer 250 can act as an etch stop to prevent damage to the neighboring vertical pillar 260 during etching. Additional portions, for example top or bottom surfaces, of the second spacer layer 160 and third spacer layer 180 can be exposed by removal of the portion of the sacrificial layer.

In various embodiments, sacrificial supports 171 can remain between vertical pillars 260 and below portions of the third spacer layer 180 and overlying layers 190, 200, 210, 220, 230 to provide structural support during and after removal of portions of the sacrificial layer 170.

Figure 8:
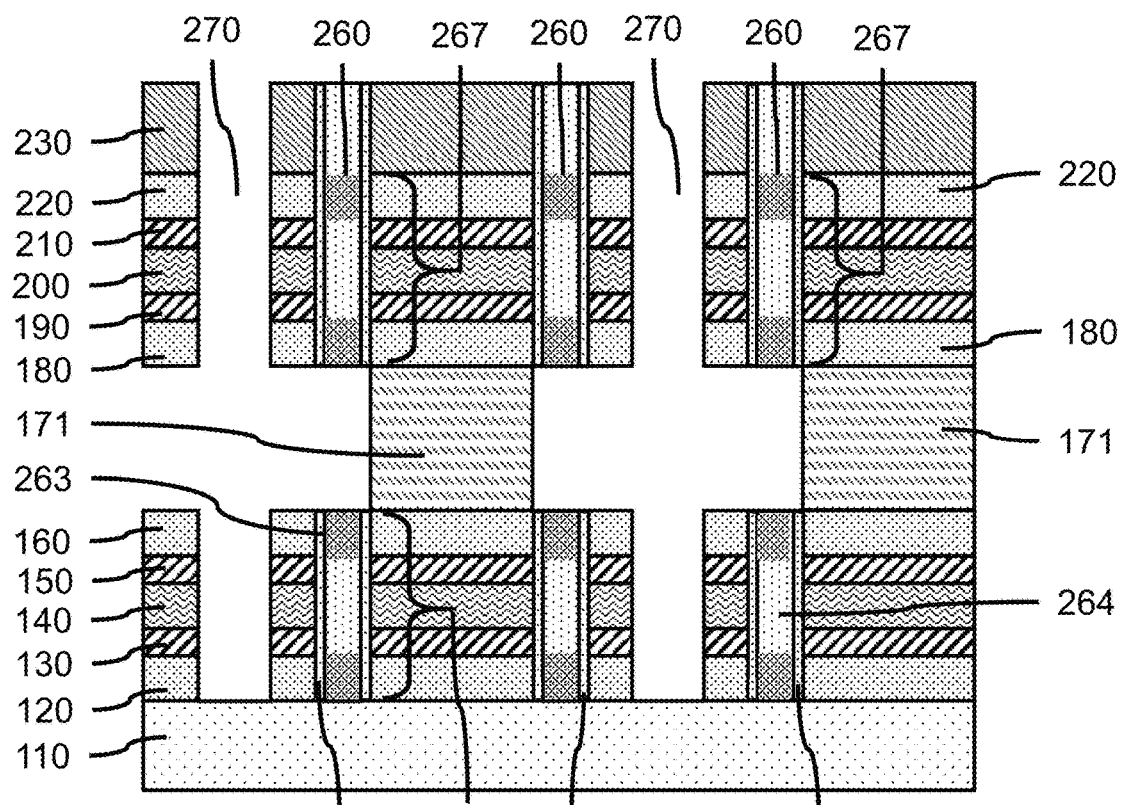
FIG. 8. is a cross-sectional side view showing removal of exposed portions of the liner layer and vertical pillars, in accordance with an embodiment of the present invention.

FIG. 8. is a cross-sectional side view showing removal of exposed portions of the liner layer and vertical pillars, in accordance with an embodiment of the present invention.

In one or more embodiments, the portion of the liner layer 250 exposed by removal of the sacrificial layer 170 to form recess 271 can subsequently be removed using a selective isotropic etch (e.g., wet chemical etch) to expose the underlying portion of the vertical pillar 260.

In one or more embodiments, the underlying portion of the vertical pillar 260 exposed by removal of the portion of the liner layer 250 in recess 271 can subsequently be removed using a selective isotropic etch (e.g., wet chemical etch) to expose the portion of the liner layer 250 on the opposite side of the vertical pillar. Removal of the portion of the vertical pillar 260 can segregate the vertical pillar 260 into an upper vertical device segment 267 and a lower vertical device segment 263. The upper vertical device segment 267 and the lower vertical device segment 263 can each include doped regions and intrinsic regions to provide source/drain and device channel regions in the vertical device segments.

In one or more embodiments, the portion of the liner layer 250 exposed by removal of the vertical pillar portion can subsequently be removed using a selective isotropic etch (e.g., wet chemical etch) to expose the underlying sacrificial support 171.

Figure 9:
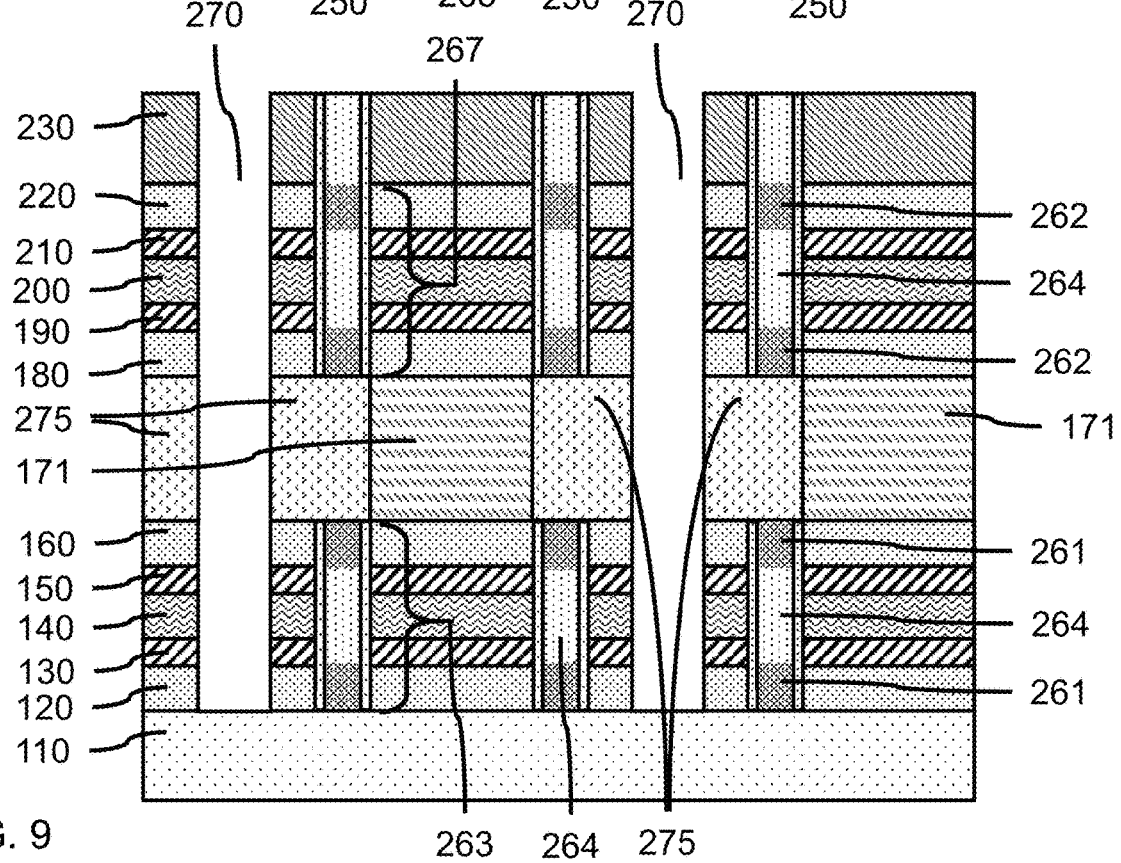
FIG. 9 is a cross-sectional side view showing a dielectric fill formed in the recesses created by removing the portions of the sacrificial layer and vertical pillars, in accordance with an embodiment of the present invention.

FIG. 9 is a cross-sectional side view showing a dielectric fill formed in the recesses created by removing the portions of the sacrificial layer and vertical pillars, in accordance with an embodiment of the present invention.

In one or more embodiments, the trenches 270 and recesses 271 can be filled with a dielectric material to form a recess fill 275. The trenches 270 and recesses 271 can be filled with the dielectric material through multiple cycles, where a portion of the trench 270 and/or recess 271 is partially filled, for example, by ALD, a directional, selective etch (e.g., RIE) is used to reopen a portion of the trench 270, and a subsequent fill process is employed to fill in additional portions of the trench 270 and/or recess 271. The process can be repeated until the recesses 271 are completely filled in and the trench 270 is reopened down to the substrate surface to provide access to the first spacer layer 120.

In one or more embodiments, the recess fills 275 are an insulating, dielectric material, including, but not limited to, silicon oxide (SiO), silicon nitride (SiN), a silicon oxynitride (SiON), a silicon carbonitride (SiCN), a silicon oxycarbonitride (SiOCN), a silicon boronitride (SiBN), a silicon borocarbide (SiBC), a low-K dielectric, Black Diamond™, or combinations thereof. In various embodiments, the recess fills 275 are a different material than sacrificial supports 171 and the other exposed layers 220, 210, 200, 190, 180, 170, 160, 150, 140, 130, 120, and substrate 110 to allow selective etching.

Figure 10:
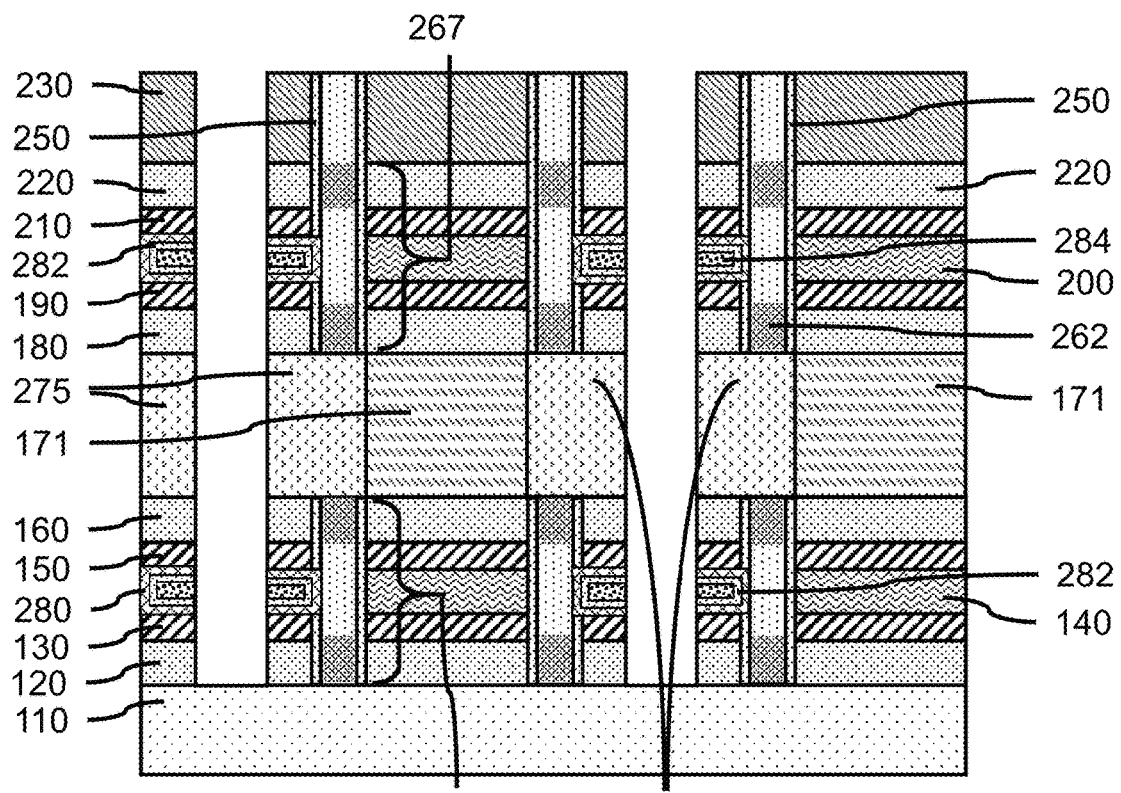
FIG. 10 is a cross-sectional side view showing exposed portions of the first gap layer and second gap layer removed and replaced with a gate structure, in accordance with an embodiment of the present invention.

FIG. 10 is a cross-sectional side view showing exposed portions of the first gap layer and second gap layer removed and replaced with a gate structure, in accordance with an embodiment of the present invention.

In one or more embodiments, portions of the first gap layer 140 and second gap layer 200 exposed by the trench 270 can be removed using a selective isotropic etch (e.g., wet chemical etch, dry plasma etch) to form a groove along the length of the trench between the first protective liner 130 and the second protective liner 150, and between the third protective liner 190 and fourth protective liner 210. Removal of the portion of the gap layers 140, 200 can expose portions of the liner layer 250 on an intrinsic portion 264 of each of the vertical device segments 263, 267. The depth of the groove can be in a range of about 10 nm to about 50 nm, or about 15 nm to about 50 nm, or about 15 nm to about 40 nm, wherein the depth of the groove can be the same as the distance, D1, between a trench 270 and an adjacent vertical pillar 260.

In one or more embodiments, the exposed portion of the liner layer 250 can be removed using a selective isotropic etch (e.g., wet chemical etch) to expose the underlying portion of the vertical device segment 263, 267.

In one or more embodiments, a gate structure can be formed in the groove between protective liners 130, 150, and between protective liners 190, 210. A gate structure can include a gate dielectric layer 280, a work function layer 282, and a gate fill layer 284.

In one or more embodiments, a gate dielectric layer 280 can be formed on the exposed portions of the lower vertical device segment 263 and upper vertical device segment 267, and other exposed surfaces, where the gate dielectric layer 280 can be formed by conformal depositions (e.g., ALD, PEALD). A work function layer 282 can be formed on the gate dielectric layer 280 by a conformal deposition. Portions of the gate dielectric layer 280 and work function layer 282 on the sidewalls and end walls of the trench 270 can be removed using a directional etch.

In one or more embodiments, a gate dielectric layer 280 can be silicon oxide (SiO), silicon nitride (SiN), silicon oxynitride (SiON), boron nitride (BN), high-k dielectric materials, or a combination thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In various embodiments, the gate dielectric layer 280 can have a thickness in the range of about 7 Å to about 30 Å, or about 7 Å to about 10 Å, or about 1 nm to about 2 nm, although other thicknesses are contemplated.

In one or more embodiments, a work function material (WFM) can form a work function layer 282 on the gate dielectric layer 280. The work function layer 282 can be deposited on the gate dielectric layer 280 by a conformal deposition (e.g., ALD, PEALD, or a combination thereof), to a predetermined thickness.

In various embodiments, the work function layer 282 can include, but not necessarily be limited to, titanium nitride (TiN), tantalum nitride (TaN) or ruthenium (Ru), for a PFET. The work function layer 282 can include, but not necessarily be limited to, titanium nitride (TiN), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN), lanthanum (La) doped TiN or lanthanum (La) doped TaN, for an NFET.

The work function layer 282 can have a thickness in the range of about 1 nm to about 10 nm, or about 2 nm to about 5 nm, or about 1 nm to about 3 nm, or about 2 nm, although other thicknesses are contemplated.

In one or more embodiments, a gate fill layer 284 can be formed on the gate dielectric layer 280 and work function layer 282. Portions of the gate fill layer 284 in the trench can be removed by selective etching.

The gate fill layer 284 can be made of a conductive material, which can be a metal, for example, tungsten (W), copper (Cu), cobalt (Co), tantalum (Ta), titanium (Ti), manganese (Mn); a conductive metal compound, for example, tantalum nitride (TaN), titanium nitride (TiN), titanium carbide (TiC), a copper manganese alloy (Cu—Mn), or any suitable combination thereof.

Figure 11:
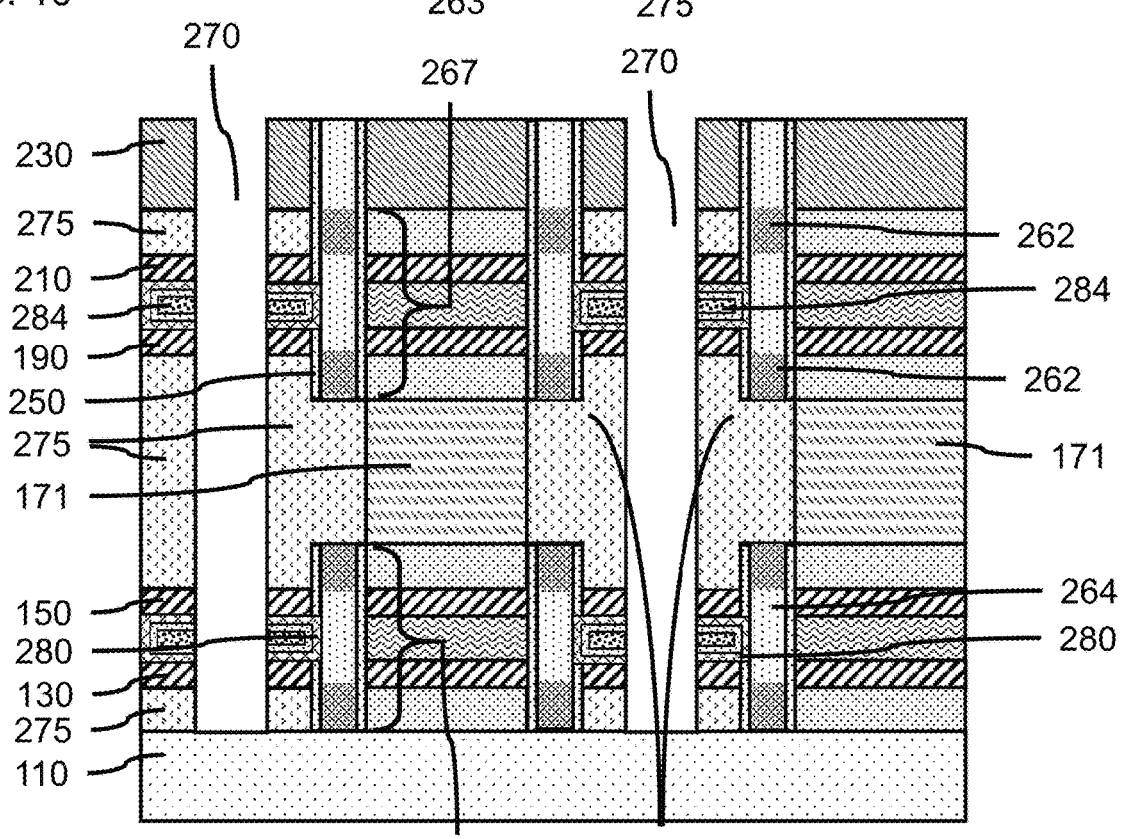
FIG. 11 is a cross-sectional side view showing replacement of the spacer layers with recess fills, in accordance with an embodiment of the present invention.

FIG. 11 is a cross-sectional side view showing replacement of the spacer layers with recess fills, in accordance with an embodiment of the present invention.

In one or more embodiments, portions of the spacer layers 120, 160, 180, 220 exposed by trench 270 can be removed using a selective isotropic etch (e.g., wet chemical etch, dry plasma etch) to form a groove along the length of the trench 270 adjacent to a protective liner. The depth of the groove can be about the same as the groove formed in the gap layers for the gate structures, as determined by distance, D1.

In one or more embodiments, the grooves can be filled with an insulating, dielectric material, that can be the same as recess fills 275. The size of the recess fills 275 can, thereby, be increased, and be adjacent to the protective liners 130, 150, 190, 210 and liner layers 250. The recess fills 275 and protective liners can be the same material, or the protective liners can be a different dielectric material.

Figure 12:
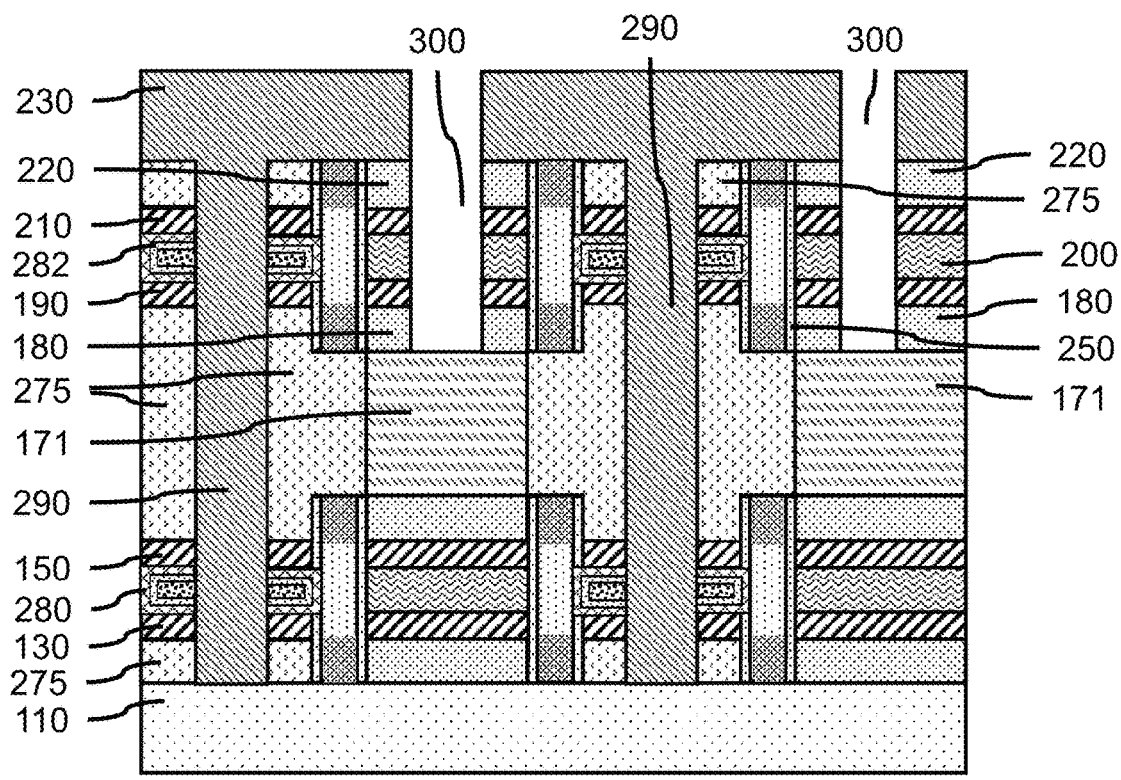
FIG. 12 is a cross-sectional side view showing the initial trenches filled with a lithographic mask plug, and access trenches formed above the sacrificial supports, in accordance with an embodiment of the present invention.

FIG. 12 is a cross-sectional side view showing the initial trenches filled with a lithographic mask plug, and access trenches formed above the sacrificial supports, in accordance with an embodiment of the present invention.

In one or more embodiments, another layer of the lithographic mask material can be deposited on lithographic mask layer 230 to fill in the trenches 270 with lithographic mask plugs 290. The lithographic mask plugs 290 can be the same material as lithographic mask layer 230.

In one or more embodiments, access trenches 300 can be formed in the lithographic mask layer 230, fourth spacer layer 220, fourth protective liner 210, second gap layer 200, third protective liner 190, and third spacer layer 180, down to the top surface of the sacrificial supports 171. The access trenches 300 can be formed by a non-selective directional etch (e.g., non-selective RIE) or successive selective directional etches.

Figure 13:
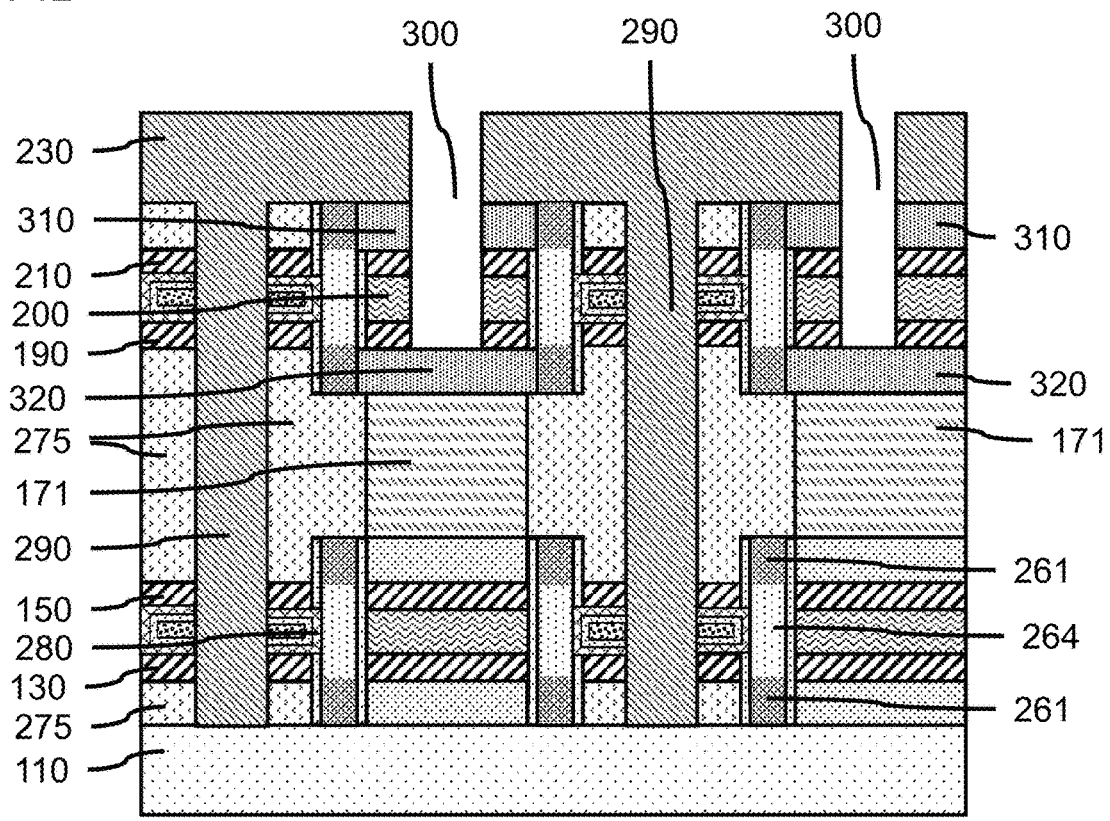
FIG. 13 is a cross-sectional side view showing additional portions of the spacer layers removed and replaced with either doped semiconductor source/drains or conductive contacts to doped regions of the upper vertical device segments, in accordance with an embodiment of the present invention.

FIG. 13 is a cross-sectional side view showing additional portions of the spacer layers removed and replaced with either doped semiconductor source/drains or conductive contacts to doped regions of the upper vertical device segments, in accordance with an embodiment of the present invention.

In one or more embodiments, the portions of the fourth spacer layer 220 and third spacer layer 180 exposed by the access trenches 300 can be removed using a selective, isotropic etch. The underlying liner layers 250 can be exposed by removal of the portions of the fourth spacer layer 220 and third spacer layer 180. The exposed portions of the liner layers 250 can be removed using a selective, isotropic etch to expose the sidewalls of the upper vertical device segment 267, which can include n-type dopant regions 261 or p-type dopant regions 262 depending on the stacking order of nFETs and pFETs.

In one or more embodiments, upper source/drain contacts 310 and upper source/drain slabs 320 can be formed in the grooves formed by removal of the portions of the fourth spacer layer 220 and third spacer layer 180. In various embodiments, the upper source/drain contacts 310 and upper source/drain slabs 320 can be formed by conformal deposition or epitaxial growth on the sidewalls of the upper vertical device segments 267 depending on the material of the upper source/drain contacts 310 and upper source/drain slabs 320.

In one or more embodiments, the upper source/drain contacts 310 and upper source/drain slabs 320 can be a doped semiconductor material that can form source/drains external to but electrically connected to intrinsic regions of the upper vertical device segment 267. The upper source/drain contacts 310 and upper source/drain slabs 320 can be n-doped or p-doped depending on the polarity of the FET device being fabricated.

In one or more embodiments, the upper source/drain contacts 310 and upper source/drain slabs 320 can be a conductive materials, including, but not limited to, metal silicides (e.g., tungsten silicide (WSi$_x$), titanium silicide (TiSi$_x$), cobalt silicide (CoSi$_x$), molybdenum silicide (MoSi$_x$), and nickel silicide (NiSi), or any suitable combination thereof), metals (e.g., tungsten (W), copper (Cu), cobalt (Co), tantalum (Ta), titanium (Ti), manganese (Mn); a conductive metal compound, for example, tantalum nitride (TaN), titanium nitride (TiN), titanium carbide (TiC), a copper manganese alloy (Cu—Mn), or any suitable combination thereof), or doped semiconductor material (e.g., n-doped or p-doped silicon (Si), silicon-germanium (SiGe), silicon carbide (SiC), etc.) or a combination thereof. The upper source/drain contacts 310 and upper source/drain slabs 320 can form electrical contacts to the n-type dopant regions 261 or p-type dopant regions 262 in the upper vertical device segments 267 if present.

Figure 14:
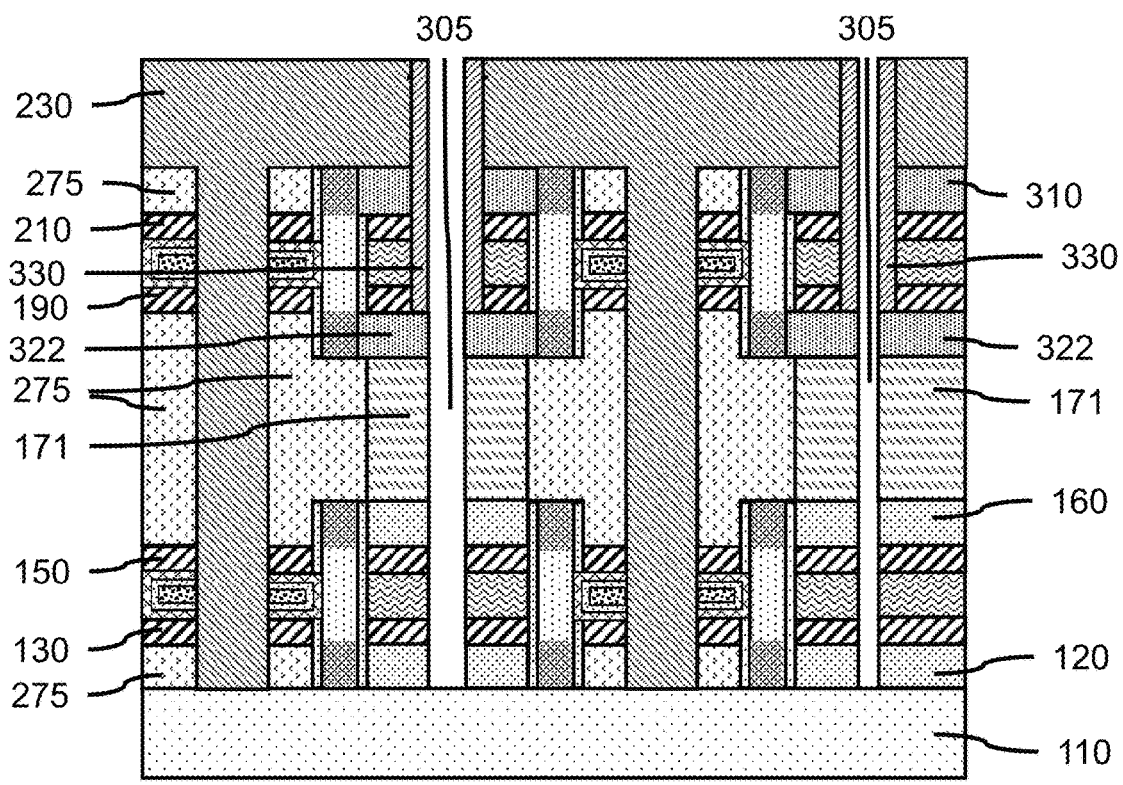
FIG. 14 is a cross-sectional side view showing trench liners formed in the access trenches, and access trench extensions formed through the sacrificial supports to the substrate, in accordance with an embodiment of the present invention.

FIG. 14 is a cross-sectional side view showing trench liners formed in the access trenches, and access trench extensions formed through the sacrificial supports to the substrate, in accordance with an embodiment of the present invention.

In one or more embodiments, a trench liner 330 can be formed within access trenches 300, where the trench liner can be formed by a conformal deposition. The trench liner 330 can be silicon nitride (SiN), a silicon oxynitride (SiON), a silicon carbonitride (SiCN), a silicon oxycarbonitride (SiOCN), a silicon boronitride (SiBN), a silicon borocarbide (SiBC), a low-K dielectric, Black Diamond™, or combinations thereof. The trench liners 330 can protect the upper source/drain contacts 310 during extension of the access trench through the lower source/drain slab 320.

In one or more embodiments, the access trenches 300 can be extended through the upper source/drain slabs 320, sacrificial supports 171, and underlying layers down to the surface of the substrate 110 to form access trench extensions 305. The access trench extensions 305 can partition the upper source/drain slabs 320 into separate upper source/drain contact sections 322.

Figure 15:
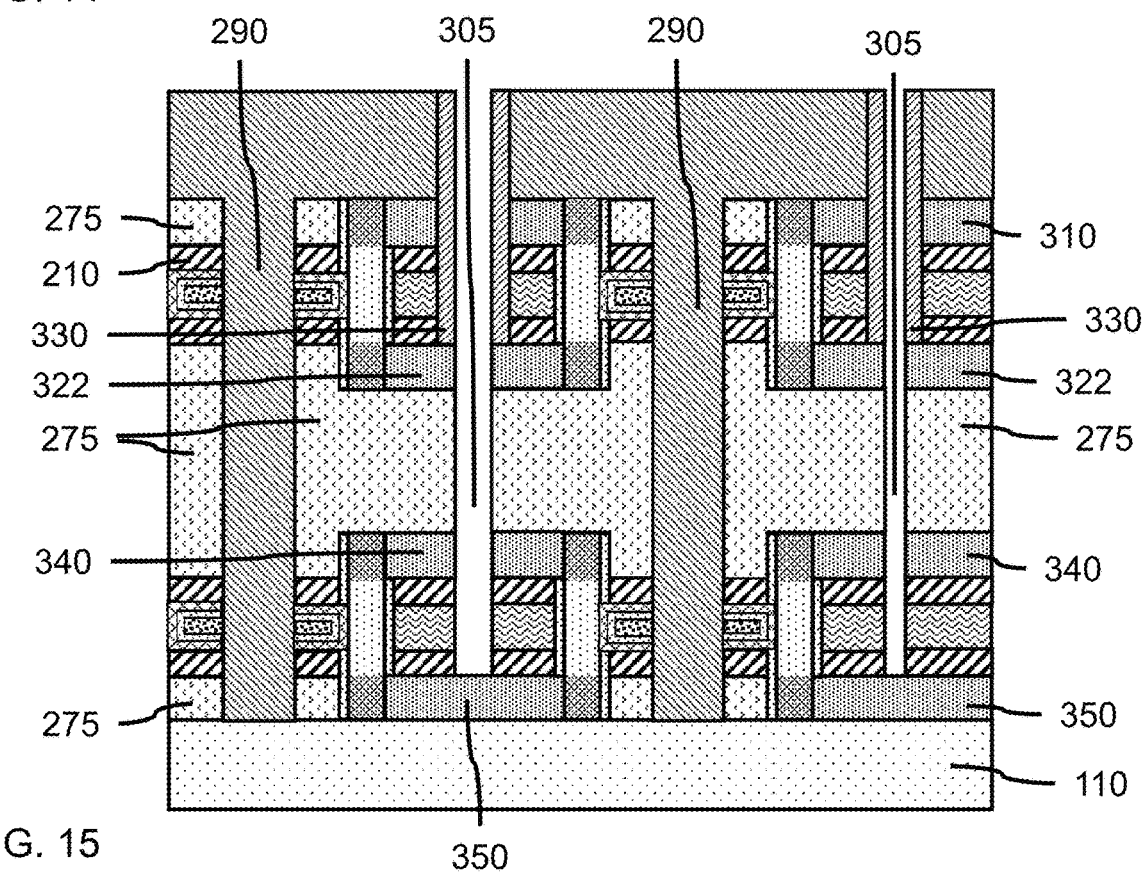
FIG. 15 is a cross-sectional side view showing additional portions of the spacer layers removed and replaced with either doped semiconductor source/drains or conductive contacts to doped regions of the lower vertical device segments, in accordance with an embodiment of the present invention.

FIG. 15 is a cross-sectional side view showing additional portions of the spacer layers removed and replaced with either doped semiconductor source/drains or conductive contacts to doped regions of the lower vertical device segments, in accordance with an embodiment of the present invention.

In one or more embodiments, the sacrificial supports 171 can be removed and a recess fill 275 formed in the spaces. The spaces, access trenches 300 and access trench extensions 305 can be filled with the dielectric material through multiple cycles, where a portion of the space, access trench 300 and access trench extension 305 is partially filled, for example, by ALD, a directional, selective etch (e.g., RIE) is used to reopen a portion of the access trench 300 and access trench extension 305, and a subsequent fill process is employed to fill in additional portions of the space. The process can be repeated until the spaces formed by removing the sacrificial supports 171 are completely filled in and the access trenches 300 and access trench extensions 305 are reopened down to the substrate surface to provide access to the first spacer layer 120 and/or substrate 110.

In one or more embodiments, the portions of the first spacer layer 120 and second spacer layer 160 exposed by the access trench extensions 305 can be removed using a selective, isotropic etch. The underlying liner layers 250 can be exposed by removal of the portions of the first spacer layer 120 and second spacer layer 160. The exposed portions of the liner layers 250 can be removed using a selective, isotropic etch to expose the sidewalls of the lower vertical device segment 263, which can include n-type dopant regions 261 or p-type dopant regions 262.

In one or more embodiments, lower source/drain contacts 340 and lower source/drain slabs 350 can be formed in the grooves formed by removal of the portions of the first spacer layer 120 and second spacer layer 160. In various embodiments, the lower source/drain contacts 340 and lower source/drain slabs 350 can be formed by conformal deposition or epitaxial growth on the sidewalls of the lower vertical device segments 263 depending on the material of the lower source/drain contacts 340 and lower source/drain slabs 350.

In one or more embodiments, the lower source/drain contacts 340 and lower source/drain slabs 350 can be a doped semiconductor material that can form source/drains external to but electrically connected to intrinsic regions of the lower vertical device segment 263. The lower source/drain contacts 340 and lower source/drain slabs 350 can be n-doped or p-doped depending on the polarity of the FET device being fabricated.

In one or more embodiments, the lower source/drain contacts 340 and lower source/drain slabs 350 can be a conductive materials, including, but not limited to, metal silicides (e.g., tungsten silicide ($WSi_x$), titanium silicide ($TiSi_x$), cobalt silicide ($CoSi_x$), molybdenum silicide ($MoSi_x$), and nickel silicide (NiSi), or any suitable combination thereof), metals (e.g., tungsten (W), copper (Cu), cobalt (Co), tantalum (Ta), titanium (Ti), manganese (Mn); a conductive metal compound, for example, tantalum nitride (TaN), titanium nitride (TiN), titanium carbide (TiC), a copper manganese alloy (Cu—Mn), or any suitable combination thereof), or doped semiconductor material (e.g., n-doped or p-doped silicon (Si), silicon-germanium (SiGe), silicon carbide (SiC), etc.) or a combination thereof. The lower source/drain contacts 340 and lower source/drain slabs 350 can form electrical contacts to the n-type dopant regions 261 or p-type dopant regions 262 in the lower vertical device segments 263 if present.

Figure 16:
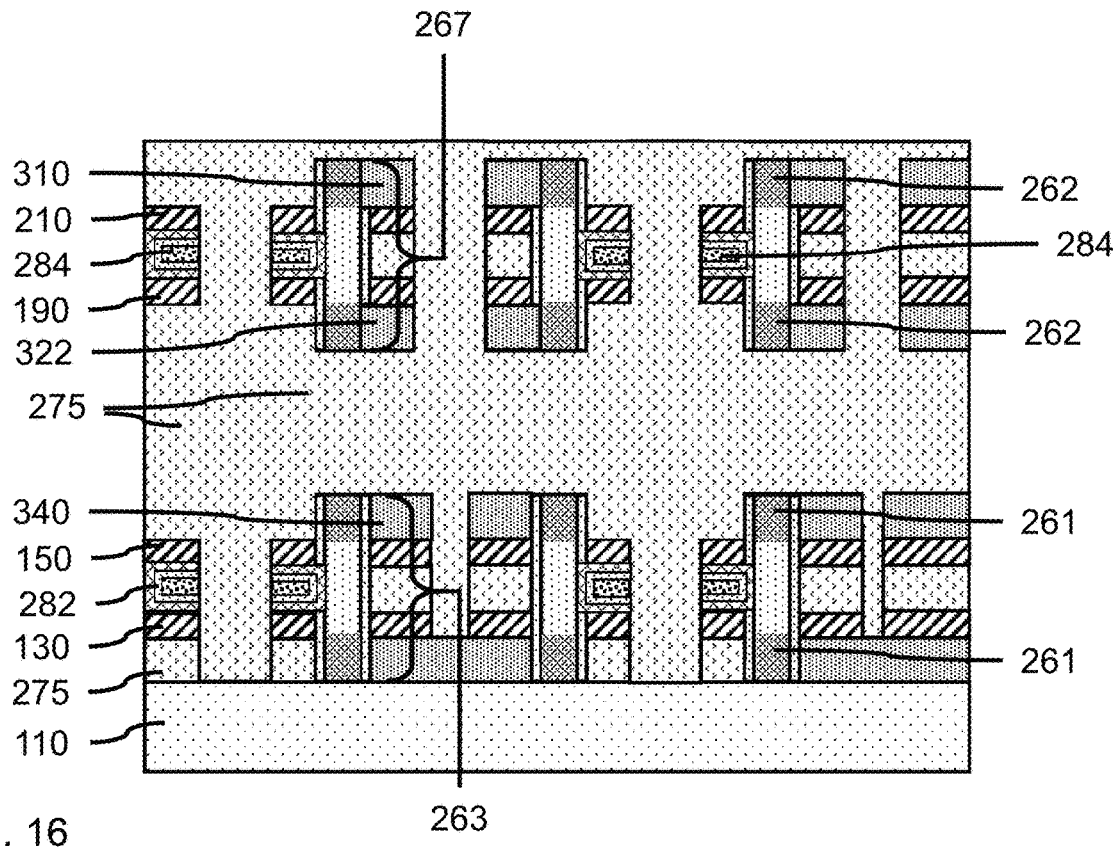
FIG. 16 is a cross-sectional side view showing the remaining portions of the gap layers replaced with recess fill, in accordance with an embodiment of the present invention.

FIG. 16 is a cross-sectional side view showing the remaining portions of the gap layers replaced with recess fill, in accordance with an embodiment of the present invention.

In one or more embodiments, remaining gap layer and spacer layer material can be removed and replaced with recess fill 275 to electrically separate different FET devices. The recess fill 275 can fill in the access trenches 300 and access trench extensions 305, as well as the trenches 270 after removing the lithographic mask plugs 290.

The gate fill layer 284 can be conductive bars orthogonal to the upper and lower vertical device segments 263, 267. The source/drain contacts 310, 340 and upper source/drain contact sections 322 and lower source/drain slabs 350 can be n- or p-doped semiconductor or conductive bars orthogonal to the upper and lower vertical device segments 263, 267.

Figure 17:
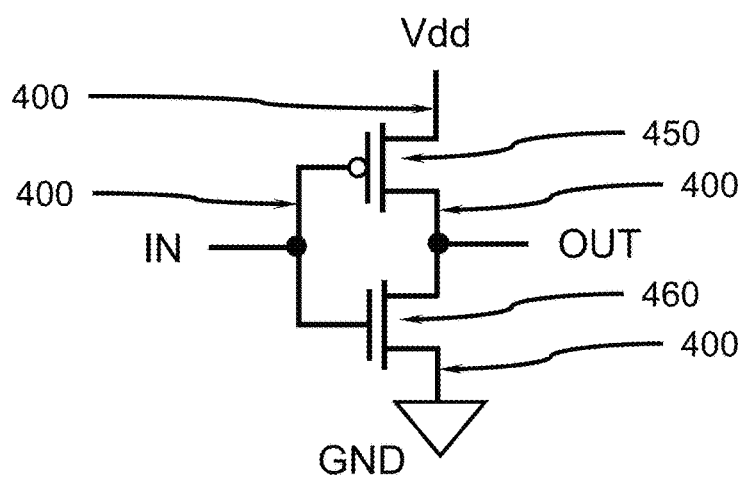
FIG. 17 shows a schematic diagram of a stacked device circuit, in accordance with an embodiment of the present invention.

FIG. 17 shows a schematic diagram of a stacked device circuit, in accordance with an embodiment of the present invention.

In one or more embodiments, a stacked arrangement of two or more vertical transport field effect transistors (VT FETs) can be electrically coupled to form a CMOS circuit or an inverter circuit, a flip-flop, or an electrically erasable programmable read-only memory (EEPROM) circuit. The upper device can be electrically coupled to the lower device through the lower source/drain contacts 340, lower source/drain slabs 350, upper source/drain contacts 310, and upper source/drain sections 322, with conductive lines 400. The upper device 450 can be formed by an upper vertical device segment 267 and gate structure, and the lower device 460 can be formed by a lower vertical device segment 263 and gate structure. The lower source/drain slabs 350 can be electrically connected to ground (GND). The upper source/drain contacts 310 can be electrically connected to a drain voltage, Vdd. The upper source/drain contact section 322 can be electrically connected to a lower source/drain contact 340 to provide a signal out line (OUT). The gate fill layers 284 of the upper device and lower device can be electrically coupled and connected to a signal in line (IN).

Figure 18:
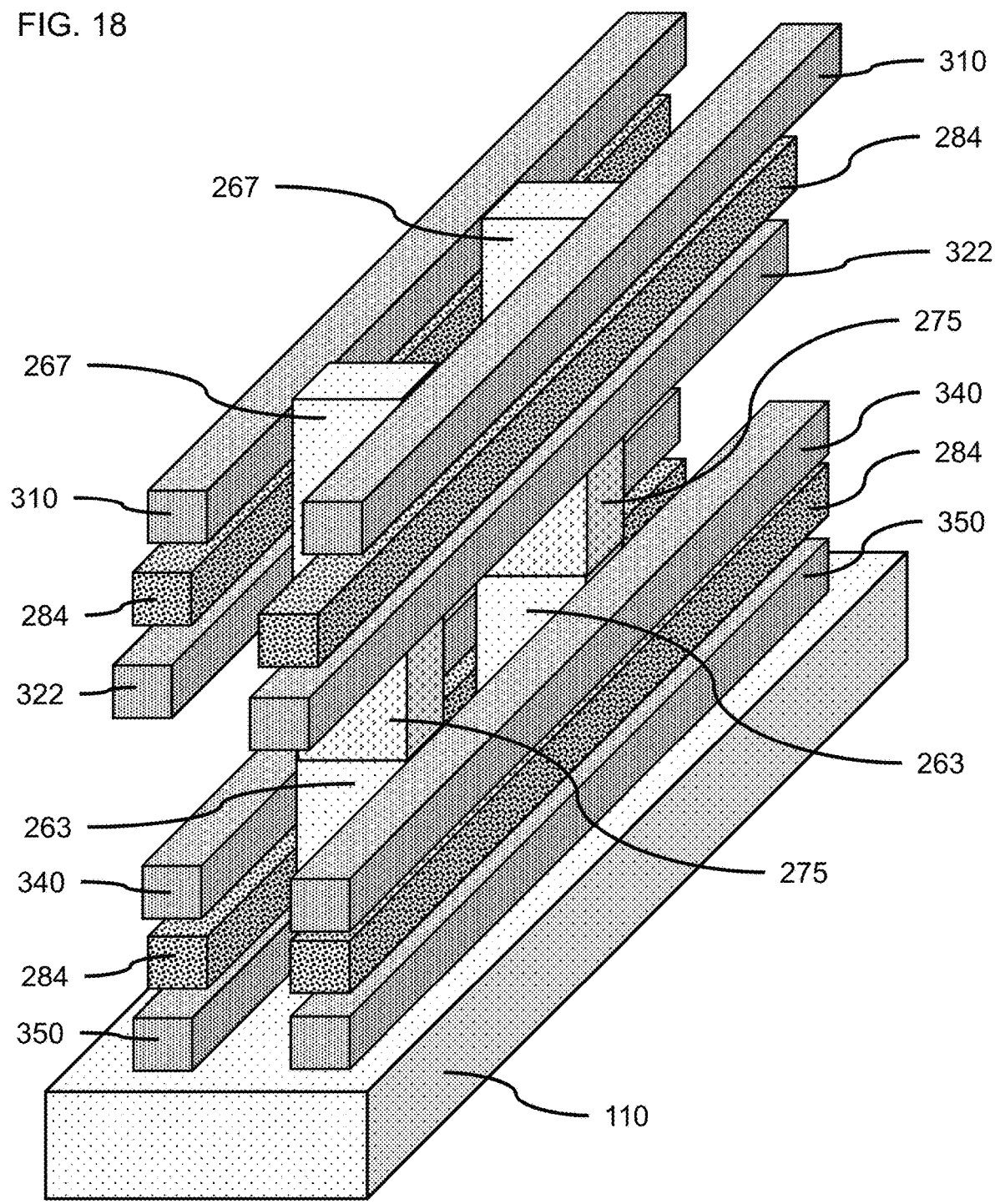
FIG. 18 is a three dimensional cut-away view showing gate fill layers and source/drain contacts adjoining portions of stacked upper and lower vertical device segments, in accordance with an embodiment of the present invention.

FIG. 18 is a three dimensional cut-away view showing gate fill layers and source/drain contacts adjoining portions of stacked upper and lower vertical device segments, in accordance with an embodiment of the present invention.

In various embodiments, stacked upper and lower vertical device segments 263, 267 can be in electrical contact through the lower source/drain contacts 340 and lower source/drain slabs 350 or upper source/drain contacts 310 and upper source/drain slabs 320. The gate fill layer 284 can couple the gates of adjacent vertical device segments together, and conductive lines can couple the gate structures of stacked devices together.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the s g lar forms "a" "a and the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is twined over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A stacked fin field effect device, comprising:
    a lower vertical device segment on a supporting substrate of a semiconductor material, wherein the lower vertical device segment includes an epitaxial material that is present on the semiconductor material of the supporting substrate and further includes a lower source/drain contact laterally adjacent to an upper doped region of the lower vertical device segment, and a lower source/drain slab laterally adjacent to a lower doped region of the lower vertical device segment;
    an upper vertical device segment, wherein a length of an upper channel region of the upper vertical device segment is co-linear with a length of a lower channel region of the lower vertical device segment so that the upper channel region and lower channel region are arranged in a single column, and the length of the length of the upper channel region and the length of the lower channel region is orthogonal to a plane defined by an upper surface of the supporting substrate, the upper channel region including an upper insulating liner layer on opposing sides of an upper semiconductor channel, and the lower channel region including a lower insulating liner layer on opposing sides of a lower semiconductor channel, wherein an entirety of the upper insulating liner layer and an entirety of the lower insulating liner layer are co-linear with one another across their entirety along a single direction; and a recess fill between the upper semiconductor channel and the lower semiconductor channel, wherein the recess fill electrically separates the upper vertical device segment from the lower vertical device segment.

2. The stacked fin field effect device of claim 1, wherein each of the lower vertical device segment and the upper vertical device segment includes a gate structure laterally adjacent to each of the intrinsic regions.

3. The stacked fin field effect device of claim 2, further comprising a first protective liner between the substrate and the gate structure on the lower vertical device segment, and a second protective liner on the opposite side of the gate structure on the lower vertical device segment from the first protective liner.

4. The stacked fin field effect device of claim 3, further comprising a third protective liner and a fourth protective liner on opposite sides of the gate structure on the upper vertical device segment.

5. The stacked fin field effect device of claim 4, wherein the first protective liner, second protective liner, third protective liner, fourth protective liner, are silicon borocarbonitride (SiBCN).

6. The stacked fin field effect device of claim 5, further comprising a liner layer on a sidewall of each of the lower vertical device segment and the upper vertical device segment.

7. The stacked fin field effect device of claim 2, further comprising a portion of a first gap layer on a sidewall of the lower vertical device segment opposite the gate structure on the lower vertical device segment, and a portion of a second gap layer on the sidewall of the upper vertical device segment opposite the gate structure on the upper vertical device segment.

8. The stacked fin field effect device of claim 7, wherein the first gap layer and the second gap layer are a dielectric material selected from the group consisting of silicon oxide (SiO), silicon nitride (SiN), a silicon oxynitride (SiON), a silicon carbonitride (SiCN), a silicon oxycarbonitride (SiOCN), a silicon boronitride (SiBN), a silicon borocarbide (SiBC), a low-K dielectric, Black Diamond™, or combinations thereof.

9. The stacked fin field effect device of claim 8, wherein the recess fill is an insulating, dielectric material selected from the group consisting of silicon oxide (SiO), silicon nitride (SiN), a silicon oxynitride (SiON), a silicon carbonitride (SiCN), a silicon oxycarbonitride (SiOCN), a silicon boronitride (SiBN), a silicon borocarbide (SiBC), a low-K dielectric, Black Diamond™, and combinations thereof.

10. A stacked fin field effect device, comprising:
a lower vertical device segment including a first portion of a vertical pillar having an n-doped region on each of opposite sides of an intrinsic region, which further includes a lower source/drain contact laterally adjacent to an upper one of the n-doped regions of the lower vertical device segment, and a lower source/drain slab laterally adjacent to a lower one of the n-doped regions of the lower vertical device segment, wherein the lower vertical device segment is present over a supporting substrate of a semiconductor material, and further including the lower vertical device segment with an epitaxial material that is present on the semiconductor material of the supporting substrate;

an upper vertical device segment including a second portion of the vertical pillar having a p-doped region on each of opposite sides of an intrinsic region, wherein a length of a channel region for the upper vertical device segment is co-linear with a length of a channel region for the lower vertical device segment, and the length of the length of the upper channel region and the length of the lower channel region is orthogonal to a plane defined by an upper surface of the supporting substrate, the upper vertical device segment including an upper insulating liner layer on opposing sides of an upper semiconductor channel, and the lower vertical device segment including an lower insulating liner layer on opposing sides of a lower semiconductor channel, wherein an entirety of the upper insulating liner layer and an entirety of the lower insulating liner layer are co-linear with one another across their entirety along a single direction; and a recess fill between the upper semiconductor channel and the lower semiconductor channel, wherein the recess fill electrically separates the upper vertical device segment from the lower vertical device segment.

11. The stacked fin field effect device of claim 10, further comprising a first gate structure laterally adjacent to the intrinsic region of the lower vertical device segment, and a second gate structure adjacent to the intrinsic region of the upper vertical device segment.

12. The stacked fin field effect device of claim 11, further comprising a liner layer on a sidewall of each of the lower vertical device segment and the upper vertical device segment.

13. The stacked fin field effect device of claim 12, wherein the first and second gate structures each include a gate dielectric layer, a work function layer, and a gate fill layer.

14. The stacked fin field effect device of claim 13, further comprising an upper source/drain contact laterally adjacent to an upper one of the p-doped regions of the upper vertical device segment, and an upper source/drain slab laterally adjacent to a lower one of the p-doped regions of the upper vertical device segment.

15. A stacked fin field effect device, comprising:
a lower vertical device segment including a first portion of a vertical pillar having a doped region on each of opposite sides of an intrinsic region, and further including a lower source/drain contact laterally adjacent to an upper one of the doped regions of the lower vertical device segment, and a lower source/drain slab laterally adjacent to a lower one of the doped regions of the lower vertical device segment and further including the lower vertical device segment is present over a supporting substrate of a semiconductor material, wherein the lower vertical device segment includes an epitaxial material that is present on the semiconductor material of the supporting substrate;

an upper vertical device segment including a second portion of the vertical pillar having a doped region on each of opposite sides of an intrinsic region, wherein a length of an upper channel region for the upper vertical device segment is co-linear with a length of a lower channel region for the lower vertical device segment and the length of the upper channel region and the length of the lower channel region are orthogonal to a plane defined by an upper surface of the supporting substrate;

a liner layer on a sidewall of each of the lower vertical device segment and the upper vertical device segment, wherein an entirety of the liner layer of the lower vertical device segment is co-linear with an entirety of the liner layer of the upper vertical device segment so that the liner layers are co-linear across their entirety along a single direction; and a recess fill between the upper channel region and the lower channel region, wherein the recess fill electrically separates the upper vertical device segment from the lower vertical device segment.

16. The stacked fin field effect device of claim 15, further comprising a lower gate structure on at least a portion of the sidewall of the lower vertical device segment, and an upper gate structure on at least a portion of the sidewall of the upper vertical device segment.

17. The stacked fin field effect device of claim 16, wherein the lower gate structure is electrically coupled to the upper gate structure.

18. The stacked fin field effect device of claim 16, further comprising a pair of upper source/drain contacts on the upper vertical device segment, wherein one of the pair of upper source/drain contacts is on an opposite side of the upper gate structure from the other of the pair of upper source/drain contacts.

19. The stacked fin field effect device of claim 18, wherein the doped regions of the first portion of the vertical pillar include n-type dopants, and the doped regions of the second portion of the vertical pillar include p-type dopants.

* * * * *